US012582009B2

(12) United States Patent
Chung et al.

(10) Patent No.: US 12,582,009 B2
(45) Date of Patent: Mar. 17, 2026

(54) SEMICONDUCTOR PACKAGE INCLUDING PADS

(71) Applicant: Samsung Electronics Co., Ltd., Suwon-si (KR)

(72) Inventors: Hyunsoo Chung, Suwon-si (KR); Younglyong Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 325 days.

(21) Appl. No.: 18/353,167

(22) Filed: Jul. 17, 2023

(65) Prior Publication Data

US 2024/0030187 A1     Jan. 25, 2024

(30) Foreign Application Priority Data

Jul. 19, 2022     (KR) ........................ 10-2022-0089085

(51) Int. Cl.
| | |
|---|---|
| *H01L 25/065* | (2023.01) |
| *H01L 23/00* | (2006.01) |
| *H01L 23/48* | (2006.01) |

(52) U.S. Cl.
CPC ........ *H01L 25/0657* (2013.01); *H01L 23/481* (2013.01); *H01L 24/03* (2013.01); *H01L 24/05* (2013.01); *H01L 24/08* (2013.01); *H01L 24/09* (2013.01); *H01L 24/16* (2013.01); *H01L 25/0652* (2013.01);
(Continued)

(58) Field of Classification Search
CPC . H01L 25/0657; H01L 24/03; H01L 25/0652; H01L 2224/05078; H01L 23/481; H01L 24/05; H01L 24/08; H01L 24/09; H01L 2224/08148; H01L 2224/0903; H01L 24/06; H01L 24/80; H01L 2224/08123; H01L 2224/08146
See application file for complete search history.

(56) References Cited

U.S. PATENT DOCUMENTS

| | | |
|---|---|---|
| 8,981,580 B2 | 3/2015 | Jeng et al. |
| 8,994,181 B2 | 3/2015 | Chen et al. |
| | (Continued) | |

FOREIGN PATENT DOCUMENTS

| | | |
|---|---|---|
| CN | 113394183 A | 9/2021 |
| JP | 2012-069585 A | 4/2012 |
| | (Continued) | |

*Primary Examiner* — Mamadou L Diallo
(74) *Attorney, Agent, or Firm* — Wolf, Greenfield & Sacks, P.C.

(57) ABSTRACT

A semiconductor package includes a first semiconductor chip including a first substrate, a plurality of first pads on the first substrate, and a plurality of through-electrodes extending through the first substrate and connected to the plurality of first pads, and a second semiconductor chip on the first semiconductor chip, the second semiconductor chip including a second substrate, and a plurality of second pads below the second substrate and in contact with the plurality of first pads. The plurality of first pads includes a first group of first pads each including a first base layer including a first recess, and a first conductive pattern layer and a first insulating pattern layer alternately disposed in the first recess, and a second group of first pads each including a second base layer including a second recess, and a second conductive pattern layer disposed in the second recess.

20 Claims, 23 Drawing Sheets

(52) U.S. Cl.

CPC ............... *H01L 2224/03614* (2013.01); *H01L 2224/03845* (2013.01); *H01L 2224/05078* (2013.01); *H01L 2224/05166* (2013.01); *H01L 2224/05181* (2013.01); *H01L 2224/05187* (2013.01); *H01L 2224/08148* (2013.01); *H01L 2224/0903* (2013.01); *H01L 2224/16227* (2013.01); *H01L 2224/16238* (2013.01); *H01L 2225/06541* (2013.01); *H01L 2924/2075* (2013.01); *H01L 2924/20751* (2013.01)

(56) References Cited

U.S. PATENT DOCUMENTS

| | | | |
|---|---|---|---|
| 9,711,478 | B2 | 7/2017 | Cheng et al. |
| 2003/0020163 | A1 | 1/2003 | Hung et al. |
| 2008/0166836 | A1 | 7/2008 | Jobetto |
| 2013/0020704 | A1 | 1/2013 | Sadaka |
| 2015/0171050 | A1 | 6/2015 | Chen et al. |

| | | | | |
|---|---|---|---|---|
| 2016/0086899 | A1* | 3/2016 | Tong | H01L 24/16 |
| | | | | 257/782 |
| 2016/0322414 | A1* | 11/2016 | Chen | H10F 39/199 |
| 2018/0269172 | A1 | 9/2018 | Katkar et al. | |
| 2020/0381364 | A1* | 12/2020 | Tu | H01L 25/50 |
| 2021/0407891 | A1* | 12/2021 | Ma | H01L 21/76898 |
| 2022/0181299 | A1* | 6/2022 | Kim | H01L 21/568 |
| 2023/0018031 | A1* | 1/2023 | Lo | H01L 24/14 |
| 2023/0119548 | A1* | 4/2023 | Kim | H01L 23/544 |
| | | | | 257/797 |
| 2023/0141447 | A1* | 5/2023 | Lee | H01L 25/0652 |
| | | | | 257/782 |
| 2023/0154910 | A1* | 5/2023 | Chung | H01L 24/03 |
| | | | | 257/680 |
| 2023/0352460 | A1* | 11/2023 | Lee | H01L 23/49822 |

FOREIGN PATENT DOCUMENTS

| | | | |
|---|---|---|---|
| KR | 10-2021-0024869 | A | 3/2021 |
| KR | 10-2022-0036534 | A | 3/2022 |

* cited by examiner a1-a1'

Ac

10C

10C

II - II'

SEMICONDUCTOR PACKAGE INCLUDING PADS

CROSS-REFERENCE TO RELATED APPLICATION(S)

This application claims benefit of priority to Korean Patent Application No. 10-2022-0089085, filed on Jul. 19, 2022 in the Korean Intellectual Property Office, the disclosure of which is incorporated herein by reference in its entirety.

BACKGROUND

The present disclosure relates to a semiconductor package and a method of manufacturing the semiconductor package.

As demand for implementation of high capacitance, thinness, and miniaturization of electronic products increases, various types of semiconductor packages have been developed. Recently, to integrate more components (for example, semiconductor chips) into a package structure, a direct bonding technique for bonding semiconductor chips to each other without an adhesive film (for example, an NCF) or a connection bump (for example, a solder ball) has been developed.

SUMMARY

Aspects of the present disclosure include implementing a stack of semiconductor chips having an excellent-quality bonding interface, and providing a semiconductor package having improved electrical properties, and a method of manufacturing the semiconductor package.

According to an aspect of the present disclosure, there is provided a semiconductor package including a first semiconductor chip including a first substrate, a plurality of first pads on the first substrate, a first insulating layer surrounding side surfaces of the plurality of first pads, and a plurality of through-electrodes extending through the first substrate and connected to the plurality of first pads, and a second semiconductor chip on the first semiconductor chip, the second semiconductor chip including a second substrate, a plurality of second pads below the second substrate and in contact with the plurality of first pads, and a second insulating layer surrounding side surfaces of the plurality of second pads and in contact with the first insulating layer. The plurality of first pads may include a first group of first pads each including a first base layer including a first recess, and a first conductive pattern layer and a first insulating pattern layer alternately disposed in the first recess, and a second group of first pads each including a second base layer including a second recess, and a second conductive pattern layer disposed in the second recess.

According to another aspect of the present disclosure, there is provided a semiconductor package including a first semiconductor chip including a first substrate, a plurality of first pads on the first substrate, and a first insulating layer at least partially surrounding the plurality of first pads, and a second semiconductor chip on the first semiconductor chip, the second semiconductor chip including a second substrate, a plurality of second pads below the second substrate and in contact with the plurality of first pads, and a second insulating layer at least partially surrounding the plurality of second pads and in contact with the first insulating layer. At least one of the plurality of first pads may include a base layer including a recess, an outer barrier layer extending along a side surface and a lower surface of the base layer, at least one conductive pattern layer and at least one insulating pattern layer alternately disposed in the recess, and an inner barrier layer extending along a side surface and a lower surface of the at least one conductive pattern layer, and may include an upper surface defined by the base layer, the outer barrier layer, the at least one conductive pattern layer, the inner barrier layer, and the at least one insulating pattern layer.

According to another aspect of the present disclosure, there is provided a semiconductor package including a first semiconductor chip including a first substrate, a plurality of first pads on the first substrate, a first insulating layer surrounding side surfaces of the plurality of first pads, and a plurality of through-electrodes passing through the first substrate and connected to the plurality of first pads, and a second semiconductor chip on the first semiconductor chip, the second semiconductor chip including a second substrate, a plurality of second pads below the second substrate and in contact with the plurality of first pads, and a second insulating layer surrounding side surfaces of the plurality of second pads and in contact with the first insulating layer. At least one of the plurality of first pads may include a base layer including a recess and an outer wall surrounding the recess, and a conductive pattern layer and an insulating pattern layer in the recess. An uppermost surface of the outer wall of the base layer and an uppermost surface of the conductive pattern layer may be in contact with at least one of the plurality of second pads.

According to another aspect of the present disclosure, there is provided a method of manufacturing a semiconductor package, the method including preparing a semiconductor wafer including a preliminary substrate and a plurality of through-electrodes in the preliminary substrate, removing a portion of the preliminary substrate to form a substrate having a back surface from which the plurality of through-electrodes protrude, forming a preliminary protective layer and a preliminary buffer film covering the plurality of through-electrodes on the back surface of the substrate, planarizing the preliminary protective layer and the preliminary buffer film to form a flat surface on which the plurality of through-electrodes are exposed, forming a back-side insulating layer including first and second etched grooves on the flat surface, forming an outer preliminary barrier layer and a first conductive material layer on surfaces of the back-side insulating layer, the first etched groove, and the second etched groove, forming an insulating material layer on the first conductive material layer, etching the insulating material layer to form a preliminary insulating pattern layer in the first etched groove, forming an inner preliminary barrier layer and a second conductive material layer on surfaces of the first conductive material layer and the preliminary insulating pattern layer, and polishing at least a portion of the preliminary insulating pattern layer, the second conductive material layer, the inner preliminary barrier layer, the first conductive material layer, and the outer preliminary barrier layer to form a pad including an insulating pattern layer, a conductive pattern layer, an inner barrier layer, a base layer, and an outer barrier layer.

According to embodiments of the present disclosure, a pad having controlled dishing and erosion may be introduced, thereby implementing a stack of semiconductor chips having an excellent-quality bonding interface, and providing a semiconductor package having improved electrical properties and a method of manufacturing the semiconductor package.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments of the present disclosure will be described with reference to the accompanying drawings.

Figure 1A:
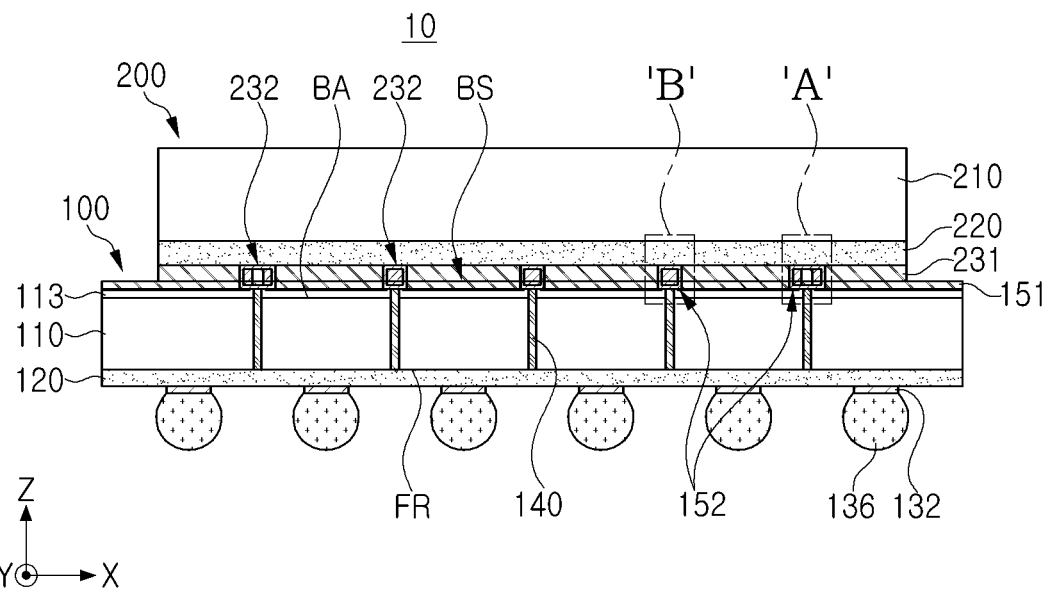
FIG. 1A is a cross-sectional view illustrating a semiconductor package according to an example embodiment of the present disclosure.
Figure 1B:
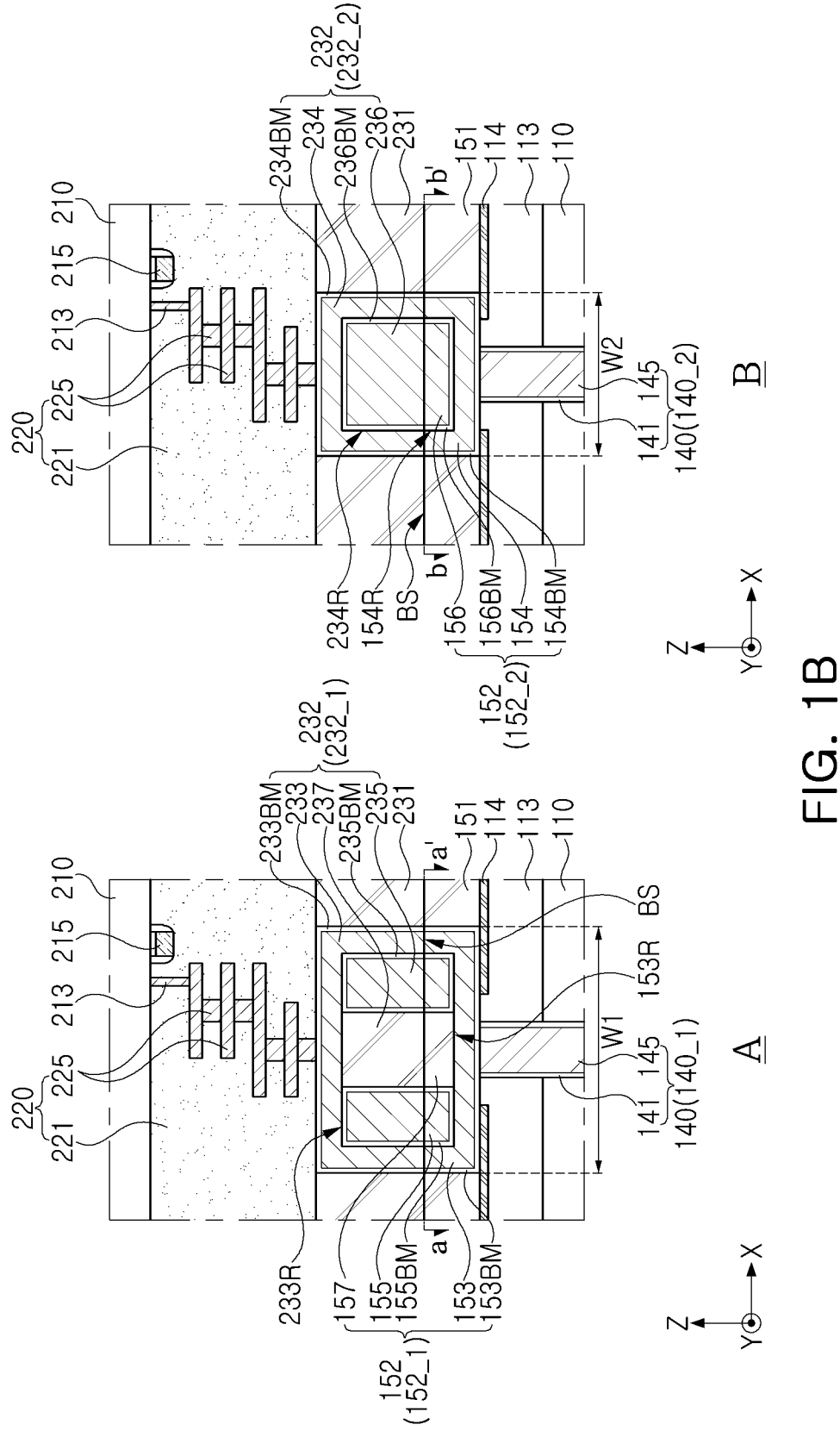
FIG. 1B includes partially enlarged views illustrating the region "A" and the region "B" of FIG. 1A.
Figure 1C:
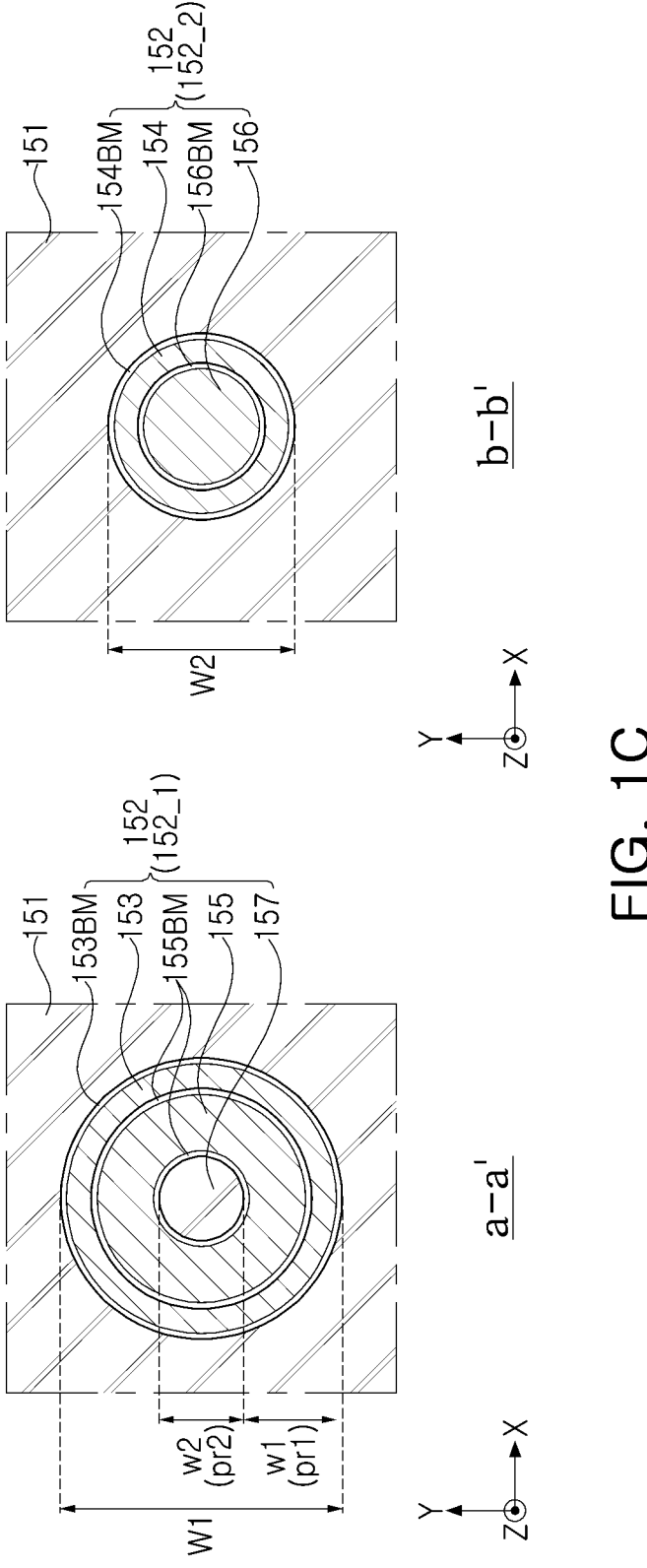
FIG. 1C includes plan views illustrating cross-sections taken along the line a-a' and the line b-b' of FIG. 1B.

FIG. 1A is a cross-sectional view illustrating a semiconductor package according to an example embodiment of the present disclosure, FIG. 1B includes partially enlarged views illustrating the region "A" and the region "B" of FIG. 1A, and FIG. 1C includes plan views illustrating cross-sections taken along the line a-a' and the line b-b' of FIG. 1B.

Figure 2:
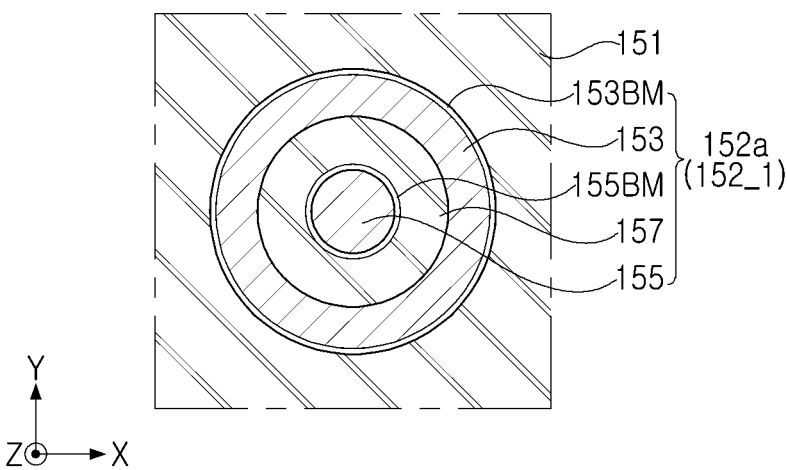
FIG. 2 includes plan views illustrating modifications of the region "A" of FIG. 1C.
Figure 2:
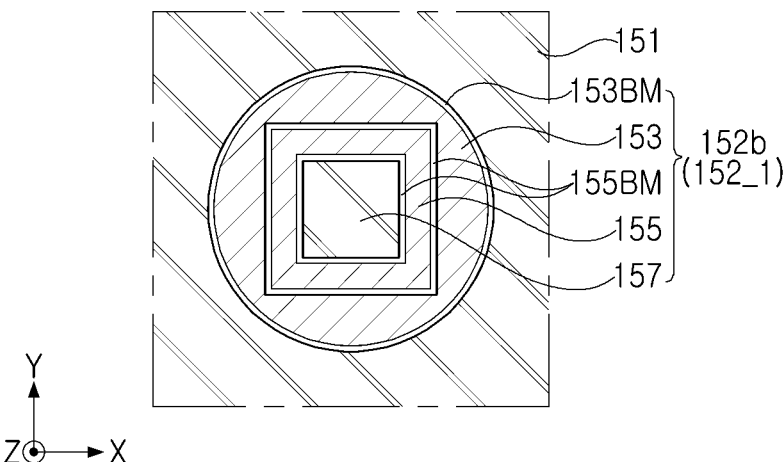
Figure 2:
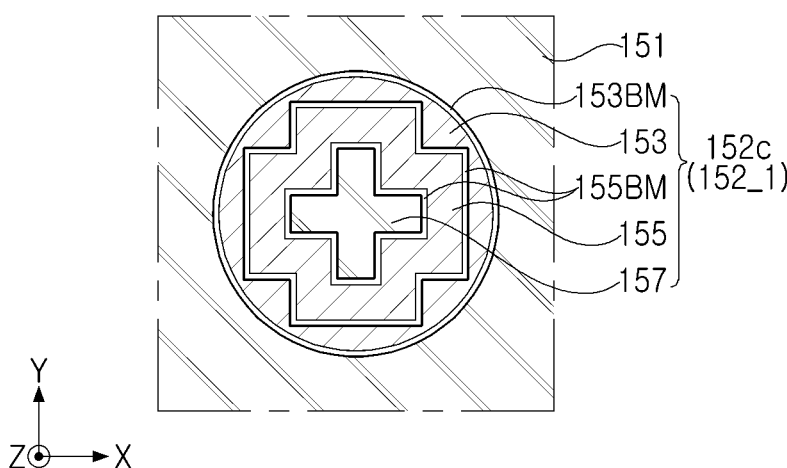

FIG. 2 includes plan views illustrating modifications of the region "A" of FIG. 1C.

First, referring to FIG. 1A, a semiconductor package 10 according to an example embodiment may include a plurality of semiconductor chips stacked in a vertical direction (Z-axis direction), for example, a first semiconductor chip 100 and a second semiconductor chip 200. An upper surface of the first semiconductor chip 100 and a lower surface of the second semiconductor chip 200 may be directly bonded and coupled (for example, hybrid bonding, direct bonding, and the like) to each other without a connection member such as a metal bump or the like. A first insulating layer 151 and first back-side pads 152 providing or defining the upper surface of the first semiconductor chip 100 may be bonded and coupled to a second insulating layer 231 and second front-side pads 232 providing or defining the lower surface of the second semiconductor chip 200, respectively. The first semiconductor chip 100 and the second semiconductor chip 200 may be electrically connected to each other through the first back-side pads 152 and second front-side pads 232 directly bonded to each other.

According to the present disclosure, at least some of a plurality of pads directly bonded to each other may be formed to have a large area, thereby improving a power integrity (PI) property of the semiconductor package 10. In addition, an insulating pattern layer may be introduced to a surface of the large-area pad, thereby controlling dishing and erosion of the large-area pad, and improving quality of a bonding interface (BS) between the first semiconductor chip 100 and the second semiconductor chip 200. For example, among the first back-side pads 152, some first pads ("152_1" in FIG. 1B) including an insulating pattern layer ("157" in FIG. 1B) therein may have a width wider than other first pads ("152_2" in FIG. 1B) not including the insulating pattern layer therein. In addition, among the second front-side pads 232, some second pads ("232_1" in FIG. 1B) may include an insulating pattern layer ("237" in FIG. 1B) therein to correspond to the first pads ("152_1" in FIG. 1B) in direct contact therewith.

Hereinafter, components of the first semiconductor chip 100 and the second semiconductor chip 200 will be described in detail with reference to FIGS. 1A-1C.

Hereinafter, "first insulating layer 151" and "second insulating layer 231" may be respectively referred to as "first upper insulating layer" or "first back-side insulating layer" and "second lower insulating layer" or "second front-side insulating layer" so as to distinguish positions of components in the first semiconductor chip 100 or the second semiconductor chip 200. In addition, "first back-side pad 152" and "second front-side pad 232" may be respectively referred to as "first pad" or "first upper pad" and "second pad" or "second lower pad."

The first semiconductor chip 100 may include a first substrate 110, a first circuit layer 120, first through-electrodes 140, a first insulating layer 151, and first upper pads 152. The first semiconductor chip 100 may have a flat upper surface provided by an upper surface of the first insulating layer 151 and upper surfaces of the first upper pads 152. For example, the upper surface of the first insulating layer 151 and the upper surfaces of the first upper pads 152 exposed from the first insulating layer 151 may be coplanar or substantially coplanar. The first insulating layer 151 may surround side surfaces of the first upper pads 152.

The first substrate 110 may be a semiconductor wafer substrate having a front surface FR and a back surface BA opposing each other. For example, the first substrate 110 may be a semiconductor wafer including a semiconductor element such as silicon or germanium, or a compound semiconductor such as silicon carbide (SiC), gallium arsenide (GaAs), indium arsenide (InAs), and indium phosphide (InP). The front surface FR may be an active surface having an active region doped with impurities, and the back surface BA may be an inactive surface positioned opposite to the front surface FR. An insulating protective layer 113 electrically insulating the first upper pad 152 and the first substrate 110 from each other may be disposed on the back surface BA of the first substrate 110. For example, the insulating protective layer 113 may include silicon oxide (SiO), silicon nitride (SiN), silicon carbide (SiC), silicon oxynitride (SiON), or silicon carbonitride (SiCN). A buffer film 114 such as a polishing stop layer or a barrier may be disposed on an upper surface of the insulating protective layer 113. For example, the buffer film 114 may include silicon nitride (SiN), silicon carbide (SiC), silicon oxynitride (SiON), or silicon carbonitride (SiCN).

The first circuit layer 120 may be disposed on a front surface FR of the first substrate 110, and may include a first wiring structure connected to the active region and a first interlayer insulating layer surrounding the first wiring structure. The first wiring structure may form an integrated circuit together with individual devices formed on the active surface of the first substrate 110. A first lower pad 132 electrically connected to a wiring structure may be disposed below the first circuit layer 120. The first lower pad 132 may be a pad structure electrically connected to the wiring structure. A connection bump 136 may be disposed below the first lower pad 132. The connection bump 136 may be, for example, a conductive bump structure including a solder ball or a copper (Cu) post. The first circuit layer 120 may have a structure the same as or similar to that of a second circuit layer 220 illustrated in FIG. 1B. Accordingly, it may be understood that the above-described first wiring structure, first interlayer insulating layer, and individual devices may have feature(s) similar to that of a second wiring structure 225, a second interlayer insulating layer 221, and individual devices 215 of the second circuit layer 220 to be described below.

A through-electrode 140 (or "first through-electrode") may pass through the first substrate 110 and the insulating protective layer 113 to electrically connect the first upper pad 152 and the first lower pad 132 to each other. The through-electrode 140 may include a via plug 145 and a side barrier layer 141 surrounding side surfaces of the via plug 145. The via plug 145 may include, for example, tungsten (W), titanium (Ti), aluminum (Al), or copper (Cu), and may be formed by a plating process, a PVD process, or a CVD process. The side barrier layer 141 may include titanium (Ti), titanium nitride (TiN), tantalum (Ta), or tantalum nitride (TaN), and may be formed by a plating process, a PVD process, or a CVD process. A side insulating film including an insulating material (for example, high aspect ratio process (HARP) oxide) such as silicon oxide, silicon nitride, or silicon oxynitride may be formed between the side barrier layer 141 and the first substrate 110.

A plurality of through-electrodes 140 may include power through-electrodes and ground through-electrodes ("140_1" in FIG. 1B) and signal through-electrodes ("140_2" in FIG. 1B). The power through-electrodes and ground through-electrodes ("140_1" in FIG. 1B) may be connected to a power supply circuit or a ground circuit of the first circuit layer 120 and/or the second circuit layer 220. The signal through-electrodes ("140_2" in FIG. 1B) may be connected to a signal (for example, a data signal) circuit of the first circuit layer 120 and/or the second circuit layer 220. For example, the plurality of through-electrodes 140 may include a first group of through-electrodes 140_1 connected to a first group of pads 152_1 and a second group of through-electrodes 140_2 connected to a second group of first pads 152_2.

The first insulating layer 151 may be disposed on the back surface BA of the first substrate 110. The first insulating layer 151 may include an insulating material capable of being bonded to and coupled to the second insulating layer 231 below the second semiconductor chip 200. For example, the first insulating layer 151 may include at least one of silicon oxide (SiO) and silicon carbonitride (SiCN). That is, at least a portion of the first insulating layer 151 may be bonded to the second insulating layer 231 to form a bonding interface BS for bonding and coupling the first semiconductor chip 100 and the second semiconductor chip 200 to each other. In addition, the first insulating layer 151 may be formed to surround a plurality of first upper pads 152 arranged on the upper surface thereof. The upper surface of the first insulating layer 151 may be coplanar or substantially coplanar with upper surfaces of the plurality of first upper pads 152.

The first upper pads 152 may be disposed on the back surface BA of the first substrate 110, and may be bonded to second lower pads 232 of the second semiconductor chip 200 to physically and electrically couple the first semiconductor chip 100 and the second semiconductor chip 200 to each other. The first upper pads 152 may include at least one pad including at least one insulating pattern layer 157 and another pad not including the insulating pattern layer 157. For example, a plurality of first pads 152 may include a first group of first pads 152_1 connected to the first group of through-electrodes 140_1 and a second group of first pads 152_2 connected to the second group of through-electrodes 140_2.

The first group of first pads 152_1 may include a first base layer 153 having a first recess 153R and an outer wall or body at least partially surrounding the first recess 153R, and at least one first conductive pattern layer 155 and at least one first insulating pattern layer 157 alternately disposed in the first recess 153R. The first group of first pads 152_1 may have an upper surface defined by the base layer 153, the conductive pattern layer 155, and the insulating pattern layer 157. The outer or upper wall or surface of the base layer 153 and the conductive pattern layer 155 may be respectively exposed from the insulating pattern layer 157 to be in contact with at least one of a plurality of second pads 232.

The first group of first pads 152_1 may further include an outer barrier layer 153BM extending along a side surface and a lower surface of the base layer 153 and an inner barrier layer 155BM extending along a side surface and a lower surface of the conductive pattern layer 155. For example, the first group of first pads 152_1 may have an upper surface defined by the first base layer 153, the first outer barrier layer 153BM, the first conductive pattern layer 155, the first inner barrier layer 155BM, and the first insulating pattern layer 157. For example, an uppermost surface of the outer wall of the first base layer 153, an uppermost surface of the first conductive pattern layer 155, and an uppermost surface of the first insulating pattern layer 157 may be coplanar or substantially coplanar. For example, an uppermost surface of the outer wall of the first base layer 153, an uppermost surface of the first outer barrier layer 153BM, an uppermost surface of the first conductive pattern layer 155, an uppermost surface of the first inner barrier layer 155BM, and an uppermost surface of the first insulating pattern layer 157 may be coplanar or substantially coplanar.

The base layer 153, the outer barrier layer 153BM, the conductive pattern layer 155, and the inner barrier layer 155BM may include a conductive material. For example, the base layer 153 and the conductive pattern layer 155 may include at least one of copper (Cu), nickel (Ni), gold (Au), and silver (Ag), and the outer barrier layer 153BM and the inner barrier layer 155BM may include at least one of titanium (Ti), titanium nitride (TiN), tantalum (Ta), and tantalum nitride (TaN). The insulating pattern layer 157 may include a material similar to that of the first insulating layer 151. For example, the insulating pattern layer 157 may include at least one of silicon oxide (SiO) and silicon carbonitride (SiCN).

The second group of first pads 152_2 may include a second base layer 154 having a second recess 154R and an outer wall or body at least partially surrounding the second recess 154R, and a second conductive pattern layer 156 disposed in the second recess 154R. The second group of first pads 152_2 may have an upper surface defined by the base layer 154 and the conductive pattern layer 156. The outer or upper wall or surface of the base layer 154 and the conductive pattern layer 156 may be in contact with at least one of the plurality of second pads 232, respectively.

The second group of first pads 152_2 may further include an outer barrier layer 154BM extending along a side surface and a lower surface of the base layer 154 and an inner barrier layer 156BM extending along a side surface and a lower surface of the conductive pattern layer 156. For example, the second group of first pads 152_2 may have an upper surface defined by the second base layer 154, the second outer barrier layer 154BM, the second conductive pattern layer 156, and the second inner barrier layer 156BM. For example, an uppermost surface of the outer wall of the second base layer 154 and an uppermost surface of the second conductive pattern layer 156 may be coplanar or substantially coplanar. For example, an uppermost surface of the outer wall of the second base layer 154, an uppermost surface of the second outer barrier layer 154BM, an uppermost surface of the second conductive pattern layer 156, and an uppermost surface of the second inner barrier layer 156BM may be coplanar or substantially coplanar.

The second base layer 154, the second outer barrier layer 154BM, the second conductive pattern layer 156, and the second inner barrier layer 156BM may include substantially a material the same as that of the first base layer 153, the first outer barrier layer 153BM, the first conductive pattern layer 155, and the first inner barrier layer 155BM, respectively.

As described above, among the plurality of first pads 152, at least some pads including the insulating pattern layer 157 (for example, the first group of first pads 152_1) may be formed to have a width wider than that of other pads not including the insulating pattern layer 157 (for example, the second group of first pads 152_2), thereby improving electrical properties of the semiconductor package 10.

For example, in a direction, parallel to the upper surface of the first semiconductor chip 100 (for example, in an X or Y-direction), the first group of first pads 152_1 may have a first width W1 wider than a second width W2 of the second group of first pads 152_2. The first width W1 of the first group of first pads 152_1 may be about 5 μm or more or about 10 μm or more. For example, the first width W1 may be in a range from about 5 μm to about 20 μm, or from about 10 μm to about 20 μm.

In addition, in the pads including the insulating pattern layer 157 (for example, the first group of first pads 152_1), a conductor layer including the base layer 153 and/or the conductive pattern layer 155 may be formed to have a width similar to that of the other pads not including the insulating pattern layer 157 (for example, the second group of first pads 152_2), thereby controlling dishing and erosion of the pads having a relatively large width or area (for example, the first group of first pads 152_1) on a level similar to that of the other pads (for example, the second group of first pads 152_2). As illustrated in FIG. 1C, it may be understood that the "conductor layer" includes the outer wall of the base layer 153 and the conductive pattern layer 155 adjacent to each other on an outer periphery of the pads including the insulating pattern layer 157 (for example, the first group of first pads 152_1). However, in some example embodiments, the "conductor layer" may include only the outer wall of the base layer 153 positioned on the outer periphery of the pad (see "152a" in FIG. 2).

For example, the first group of first pads 152_1 may have a first portion pr1 defined by the outer wall of the first base layer 153 and the first conductive pattern layer 155 adjacent thereto, and a second portion pr2 defined by the first insulating pattern layer 157, and a width w1 of the first portion pr1 may be on a level similar to that of a second width W2 of the second group of first pads 152_2. The width w1 of the first portion pr1 and the second width W2 of the second group of first pads 152_2 may be about 5 μm or less, for example, about 1 μm to about 5 μm, about 1 μm to about 4 μm, or about 3 μm to about 4 μm. Here, the "width w1 of the first portion pr1" may be understood as a shortest distance from the first outer barrier layer 153BM surrounding an outer side of the first base layer 153 to the first inner barrier layer 155BM surrounding an inner side of the first inner barrier layer 155BM. In addition, it may be understood that the "similar level" includes a process error or a slight difference in design. In some example embodiments, the first portion pr1 may be defined only by the outer wall of the first base layer 153 surrounding the first recess 153R (see "152a" in FIG. 2).

In addition, the insulating pattern layer 157 may be formed to have a width substantially equal to or narrower than a width of the conductor layers including the base layer 153 and/or the conductive pattern layer 155, thereby securing bonding quality of the pads including the insulating pattern layer 157 (for example, the first group of first pads 152_1). For example, in a direction, parallel to the upper surface of the first semiconductor chip 100 (for example, in X-direction or Y-direction), the width w2 of the second portion pr2 defined by the first insulating pattern layer 157 may be substantially equal to or narrower than the width w1 of the first portion pr1.

In addition, the insulating pattern layer 157 may be formed to have a depth of about 50% or more of a thickness of corresponding pads (for example, the first group of first pads 152_1), thereby securing bonding quality of the insulating pattern layer 157. For example, in a direction, perpendicular to the bottom surface of the first recess 153R (for example, in a Z-direction), a depth of the first recess 153R may be in a range of about 50% or more and less than about 100%, or more than about 50% and about 90% or less of a thickness of the first group of first pads 152_1.

As illustrated in FIG. 1C, the first group of first pads 152_1 may include the conductive pattern layer 155 adjacent to the outer wall of the base layer 153 and the insulating pattern layer 157 (or side surfaces thereof) surrounded by the conductive pattern layer 155. On a plane (X-Y plane), the insulating pattern layer 157 may have a circular shape, and the conductive pattern layer 155 may have a shape (e.g., ring shape) corresponding to that of a circumference of the insulating pattern layer 157. However, the shapes and arrangements of the conductive pattern layer 155 and the insulating pattern layer 157 are not limited thereto, and may be changed in various manners.

FIG. 2 includes plan views illustrating exemplary modifications of the first group of first pads 152_1.

Referring to FIG. 2, a first pad 152a according to a first modification may include the conductive pattern layer 155 disposed on a central portion of the base layer 153 and the insulating pattern layer 157 filling a space between the outer wall of the base layer 153 and the conductive pattern layer 155. On a plane (X-Y plane), the conductive pattern layer 155 may have a circular shape, and the insulating pattern layer 157 may have a shape (e.g., ring shape) corresponding to that of a circumference of the conductive pattern layer 155.

A first pad 152*b* according to a second modification may include the conductive pattern layer 155 adjacent to the outer wall of the base layer 153 and the insulating pattern layer 157 surrounded by the conductive pattern layer 155. On a plane (X-Y plane), the insulating pattern layer 157 may have a rectangular shape, and the conductive pattern layer 155 may have a shape corresponding to that of the circumference of the insulating pattern layer 157.

A first pad 152*c* according to a third modification may include the conductive pattern layer 155 adjacent to the outer wall of the base layer 153 and the insulating pattern layer 157 surrounded by the conductive pattern layer 155. On a plane (X-Y plane), the insulating pattern layer 157 may have a cross shape, and the conductive pattern layer 155 may have a shape corresponding to that of the circumference of the insulating pattern layer 157.

Referring back to FIGS. 1A to 1C, the second semiconductor chip 200 may be disposed on the first semiconductor chip 100, and may include a second substrate 210, the second circuit layer 220, and the second insulating layer 231, and a second lower pad 232. The second semiconductor chip 200 may have a flat lower surface provided or defined by a lower surface of the second insulating layer 231 and lower surfaces of the second lower pads 232. For example, the lower surface of the second insulating layer 231 and the lower surfaces of the second lower pads 232 exposed from the second insulating layer 231 may be coplanar or substantially coplanar. The second insulating layer 231 may surround side surfaces of the second lower pads 232. The first semiconductor chip 100 and the second semiconductor chip 200 may have substantially the same or similar structure, and thus the same or similar components are denoted by the same or similar reference numerals, and repeated descriptions of the same components may be omitted in the interest of brevity. For example, it may be understood that the second substrate 210 has feature(s) substantially the same as that of the above-described first substrate 110.

The second circuit layer 220 may be disposed on a front surface or an active surface of the second substrate 210, and may include a second wiring structure 225 connected to the active region and a second interlayer insulating layer 221 surrounding the second wiring structure 225.

The second interlayer insulating layer 221 may include flowable oxide (FOX), Tonen SilaZen (TOSZ), undoped silica glass (USG), borosilica glass (BSG), phosphosilaca glass (PSG), borophosphosilica glass (BPSG), plasma enhanced tetra ethyl ortho silicate (PETEOS), fluoride silicate glass (FSG), high density plasma (HDP) oxide, plasma enhanced oxide (PEOX), flowable CVD (FCVD) oxide, or combinations thereof. At least a partial region of the second interlayer insulating layer 221 surrounding the second wiring structure 225 may be configured as a low-x layer. The second interlayer insulating layer 221 may be formed using a chemical vapor deposition (CVD) process, a flowable-CVD process, or a spin coating process.

The second wiring structure 225 may have a multilayer structure including a via and a wiring pattern. For example, the second wiring structure 225 may be formed of aluminum (Al), gold (Au), cobalt (Co), copper (Cu), nickel (Ni), lead (Pb), tantalum (Ta), tellurium (Te), titanium (Ti), tungsten (W), or combinations thereof. A barrier film including titanium (Ti), titanium nitride (TiN), tantalum (Ta), or tantalum nitride (TaN) may be disposed between the wiring pattern and/or via and the second interlayer insulating layer 221. The individual devices 215 included in an integrated circuit may be disposed on the front surface of the second substrate 210. In this case, the second wiring structure 225 may be electrically connected to the individual devices 215 by an interconnection portion 213 (for example, a contact plug). The individual devices 215 may include an FET such as a flat FET or FinFET, a memory device such as flash memory, DRAM, SRAM, EEPROM, PRAM, MRAM, FeRAM, RRAM, or the like, a logic device such as AND, OR, NOT, or the like, and various active devices and/or passive devices such as a system LSI, CIS, and MEMS.

The second insulating layer 231 may be disposed below the second substrate 210 or the second circuit layer 220. The second insulating layer 231 may include an insulating material capable of being bonded and coupled to the first insulating layer 151 of the first semiconductor chip 200. For example, the second insulating layer 231 may include silicon oxide (SiO) or silicon carbonitride (SiCN). That is, at least a portion of the second insulating layer 231 may be bonded to the first insulating layer 151 to form a bonding interface BS for bonding and coupling the first semiconductor chip 100 and the second semiconductor chip 200 to each other. The second insulating layer 231 may be formed to surround a plurality of second lower pads 232 (or side surfaces thereof) arranged on the lower surface thereof. The lower surface of the second insulating layer 231 may be coplanar or substantially coplanar with lower surfaces of the plurality of second lower pads 232.

The second lower pads 232 may be bonded to the first upper pads 152 of the first semiconductor chip 100 to physically and electrically couple the first semiconductor chip 100 and the second semiconductor chip 200 to each other. The second lower pads 232 may include at least one pad including at least one insulating pattern layer 237 and another pad not including the insulating pattern layer 237. For example, the plurality of second pads 232 may include a third group of second pads 232_1 in contact with the first group of first pads 152_1 and a fourth group of second pads 232_2 in contact with the second group of first pads 152_2. The third group of second pads 232_1 may also be referred to as the first group of second pads 232_1 and the fourth group of second pads 232_2 may also be referred to as the second group of second pads 232_2.

The third group of second pads 232_1 may have feature(s) substantially the same as that of the first group of first pads 152_1. The third group of second pads 232_1 may include a third base layer 233 having a third recess 233R and an outer wall surrounding the third recess 233R, and at least one third conductive pattern layer 235 and at least one second insulating pattern layer 237 alternately disposed in the third recess 233R. The third group of second pads 232_1 may have a lower surface defined by the base layer 233, the conductive pattern layer 235, and the insulating pattern layer 237. The outer or lower wall or surface of the base layer 233 and the conductive pattern layer 235 may be respectively exposed from the insulating pattern layer 237 to be in contact with the first group of first pads 152_1.

The third group of second pads 232_1 may further include an outer barrier layer 233BM extending along a side surface and a lower surface of the base layer 233 and an inner barrier layer 235BM extending along a side surface and a lower surface of the conductive pattern layer 235. For example, the third group of second pads 232_1 may have a lower surface defined by the third base layer 233, a third outer barrier layer 233BM, the third conductive pattern layer 235, a third inner barrier layer 235BM, and the second insulating pattern layer 237.

The fourth group of second pads 232_2 may have feature(s) substantially the same as that of the second group of first pads 152_2. The fourth group of second pads 232_2 may include a fourth base layer 234 having a fourth recess 234R and an outer wall surrounding the fourth recess 234R, and a fourth conductive pattern layer 236 disposed in the fourth recess 234R. The fourth group of second pads 232_2 may have a lower surface defined by the base layer 234 and the conductive pattern layer 236. The outer or lower wall or surface of the base layer 234 and the conductive pattern layer 236 may be in contact with the second group of first pads 152_2.

The fourth group of second pads 232_2 may further include an outer barrier layer 234BM extending along a side surface and a lower surface of the base layer 234, and an inner barrier layer 236BM extending along a side surface and a lower surface of the conductive pattern layer 236. For example, the fourth group of second pads 232_2 may have a lower surface defined by the fourth base layer 234, a fourth outer barrier layer 234BM, the fourth conductive pattern layer 236, and a fourth inner barrier layer 236BM.

As described above, the third group of second pads 232_1 and the fourth group of second pads 232_2 may correspond to the first group of first pads 152_1 and the second group of first pads 152_2, respectively. Accordingly, in a direction, parallel to the lower surface of the second semiconductor chip 200 (for example, in an X or Y-direction), the third group of second pads 232_1 may have a width wider than a width of the fourth group of second pads 232_2. In the drawings, it is illustrated that the third group of second pads 232_1 has a width equal to that of the first group of first pads 152_1, and the fourth group of second pads 232_2 has a width equal to that of the second group of first pads 152_2, but the present disclosure is not limited thereto.

As described above, among the plurality of first pads 152, at least some pads including the insulating pattern layer 157 (for example, the first group of first pads 152_1) may be formed to have a width wider than that of other pads not including the insulating pattern layer 157 (for example, the second group of first pads 152_2), thereby improving electrical properties of the semiconductor package 10.

For example, in a direction, parallel to the upper surface of the first semiconductor chip 100 (for example, in an X or Y-direction), the first group of first pads 152_1 may have a first width W1 wider than a second width W2 of the second group of first pads 152_2. The first width W1 of the first group of first pads 152_1 may be about 5 μm or more or about 10 μm or more. For example, the first width W1 may be in a range from about 5 μm to about 20 μm, or from about 10 μm to about 20 μm. The third group of second pads 232_1 may have the first width W1 and/or the fourth group of second pads 232_2 may have the second width W2, but the present disclosure is not limited thereto.

Figure 3A:
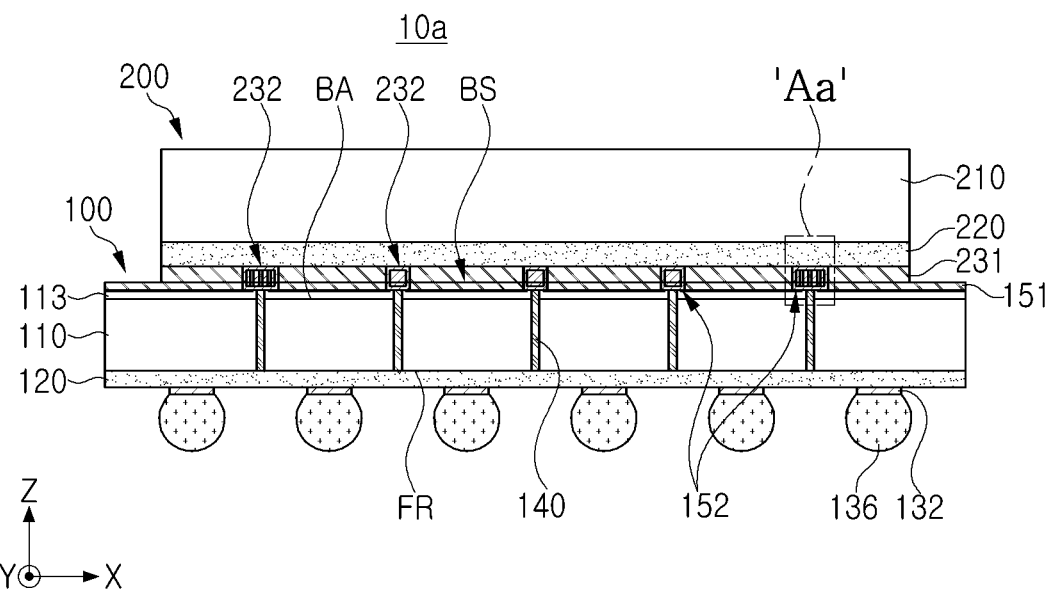
FIG. 3A is a cross-sectional view illustrating a semiconductor package according to an example embodiment of the present disclosure.
Figure 3B:
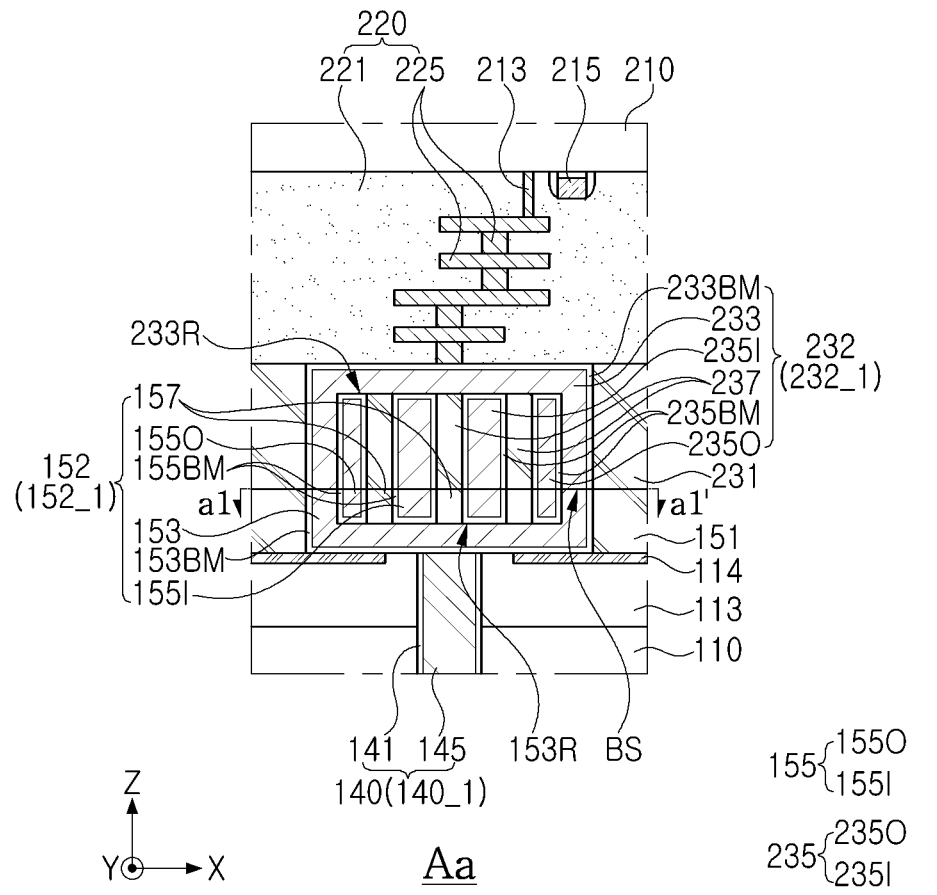
FIG. 3B is a partially enlarged view illustrating the region "Aa" of FIG. 3A.
Figure 3C:
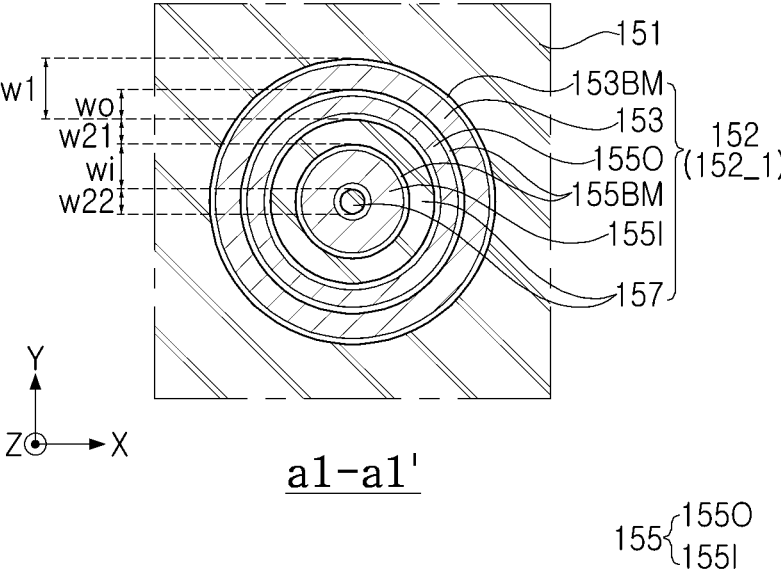
FIG. 3C is a plan view illustrating a cross-section taken along the line a1-a1' of FIG. 3B.

FIG. 3A is a cross-sectional view illustrating a semiconductor package 10a according to an example embodiment of the present disclosure, FIG. 3B is a partially enlarged view illustrating the region "Aa" of FIG. 3A, and FIG. 3C is a plan view illustrating a cross-section taken along the line a1-a1' of FIG. 3B.

Referring to FIGS. 3A and 3B, the semiconductor package 10a according to an example embodiment may have feature(s) the same as or similar to those described with reference to FIGS. 1A to 2, except that the semiconductor package 10a includes a greater number of conductive pattern layers and insulating pattern layers than the semiconductor package 10 illustrated in FIGS. 1A to 2. Hereinafter, the description of the first group of first pads 152_1 may be equally applied to the third group of second pads 232_1.

In the present example embodiment, the first conductive pattern layer 155 may include an outer pattern layer 155O adjacent to an outer wall of the first base layer 153 surrounding the first recess 153R, and an inner pattern layer 155I spaced apart from the outer pattern layer 155O. The first insulating pattern layer 157 may include an inner insulating layer surrounded by the inner pattern layer 155I and an outer insulating layer filling a space between the outer pattern layer 155O and the inner pattern layer 155I. In a direction parallel to an upper surface of the first semiconductor chip 100 (for example, in an X-direction or Y-direction), a width wi of the inner pattern layer 155I may be wider than a width wo of the outer pattern layer 155O. The width wi of the inner pattern layer 155I may be in a range of about 5 μm or less, for example, about 1 μm to about 5 μm, about 1 μm to about 4 μm, or about 3 μm to about 4 μm. A width w21 of the outer insulating layer and a width w22 of the inner insulating layer may be substantially equal to or narrower than the width wi of the inner pattern layer 155I. A width w1 of a region including the outer wall of the base layer 153 and the outer pattern layer 155O may be on a level equal to or similar to that of the width wi of the inner pattern layer 155I.

Similarly, the third conductive pattern layer 235 may include an outer pattern layer 235O adjacent to an outer wall of the third base layer 233 surrounding the third recess 233R, and an inner pattern layer 235I spaced apart from the outer pattern layer 235O. The second insulating pattern layer 237 may include an inner insulating layer surrounded by the inner pattern layer 235I and an outer insulating layer filling a space between the outer pattern layer 235O and the inner pattern layer 235I.

As described above, various numbers and shapes of the first conductive pattern layer 155 and the first insulating pattern layer 157 may be formed depending on a size and an area of the corresponding first group of first pads 152_1.

Figure 4A:
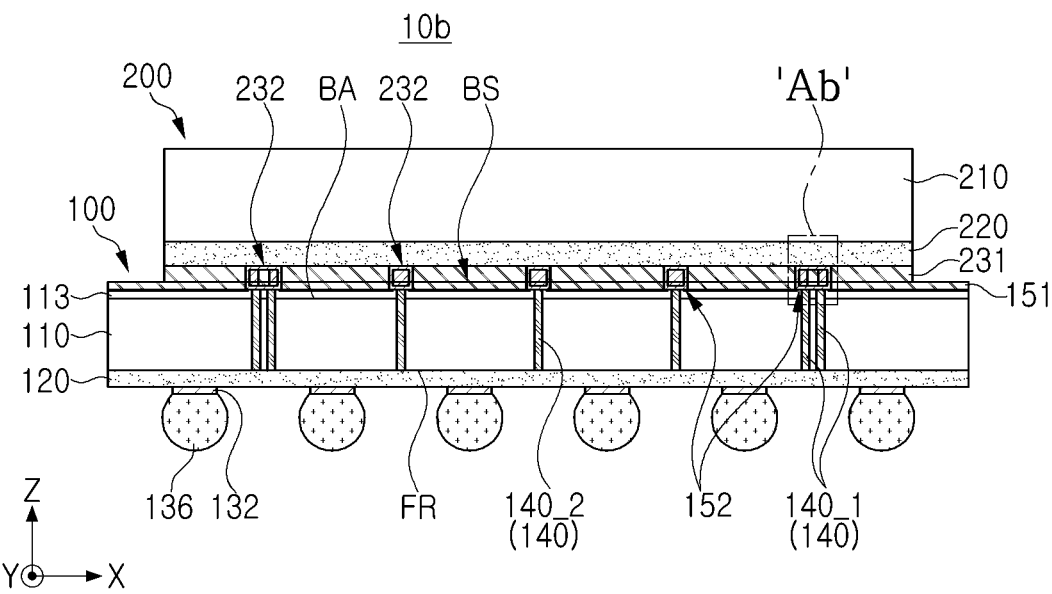
FIG. 4A is a cross-sectional view illustrating a semiconductor package according to an example embodiment of the present disclosure.
Figure 4B:
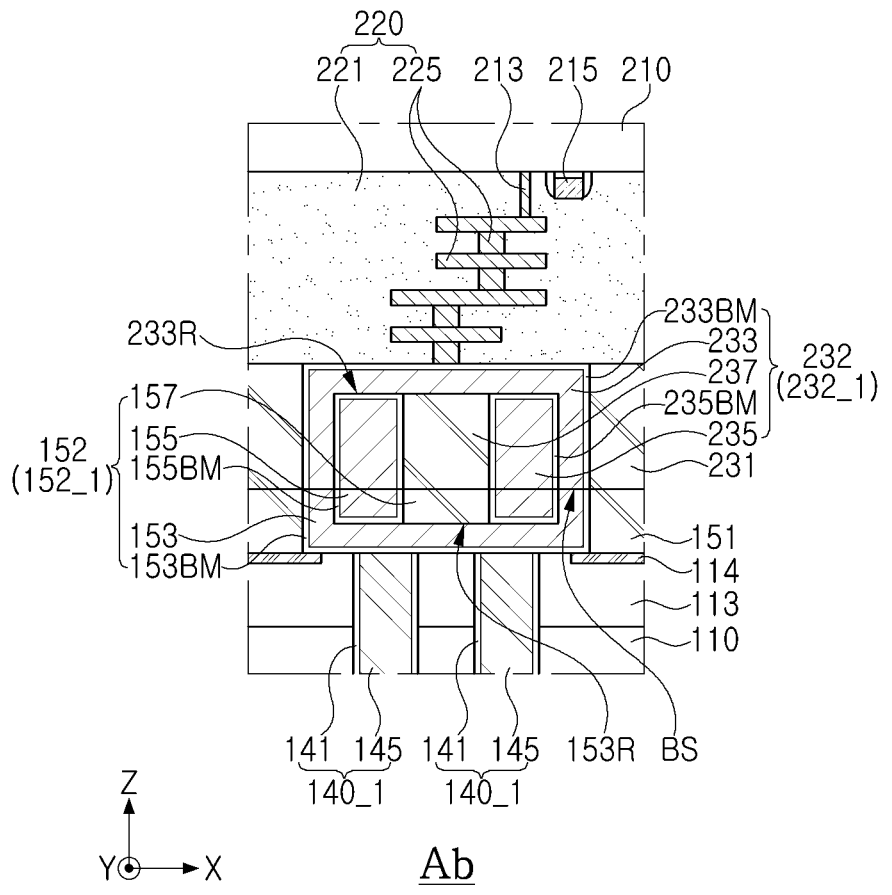
FIG. 4B is a partially enlarged view illustrating the region "Ab" of FIG. 4A.

FIG. 4A is a cross-sectional view illustrating a semiconductor package 10b according to an example embodiment of the present disclosure, and FIG. 4B is a partially enlarged view illustrating the region "Ab" of FIG. 4A.

Referring to FIGS. 4A and 4B, the semiconductor package 10b according to an example embodiment may have feature(s) the same as or similar to those described with reference to FIGS. 1A to 3C, except that the first group of first pads 152_1 is connected to a plurality of through-electrodes.

For example, the plurality of through-electrodes 140 may include a first group of through-electrodes 140_1 corresponding to the first group of first pads 152_1 in a ratio of 2:1 or more, and a second group of through-electrodes 140_2 corresponding to the second group of first pads 152_2 in a ratio of 1:1. The number of the first group of through-electrodes 140_1 connected to the first group of first pads 152_1 may be greater than that (two) illustrated in the drawings, for example, three or more. The first group of through-electrodes 140_1 may include power and/or ground through-electrodes, and the second group of through-electrodes 140_2 may include a signal through-electrode. As described above, the plurality of through-electrodes 140 may be connected to the first group of first pads 152_1 having a large area, thereby further improving electrical properties of the semiconductor package 10*b*.

Figure 5A:
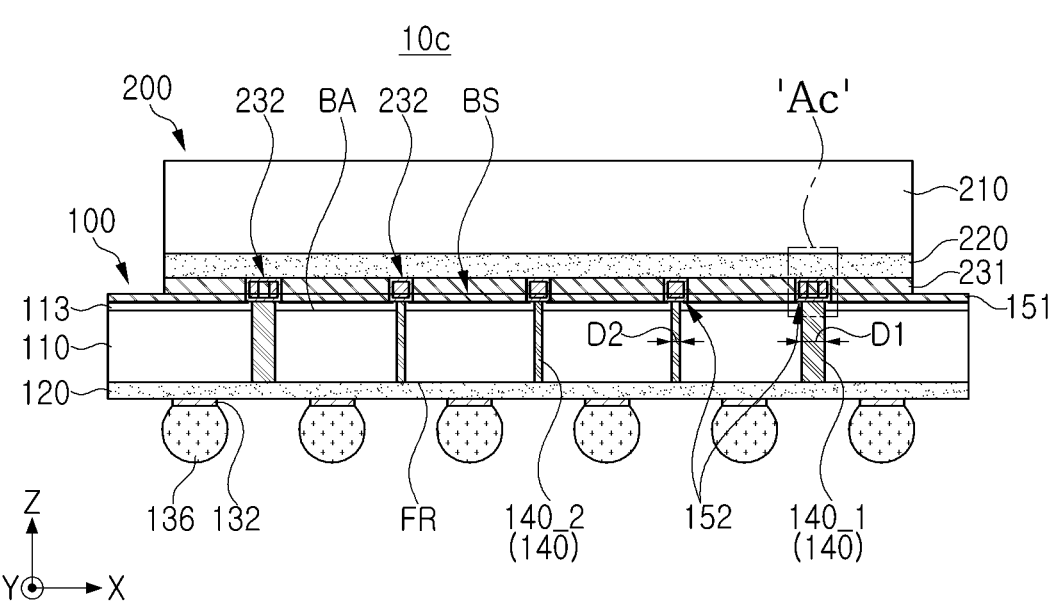
FIG. 5A is a cross-sectional view illustrating a semiconductor package according to an example embodiment of the present disclosure.
Figure 5B:
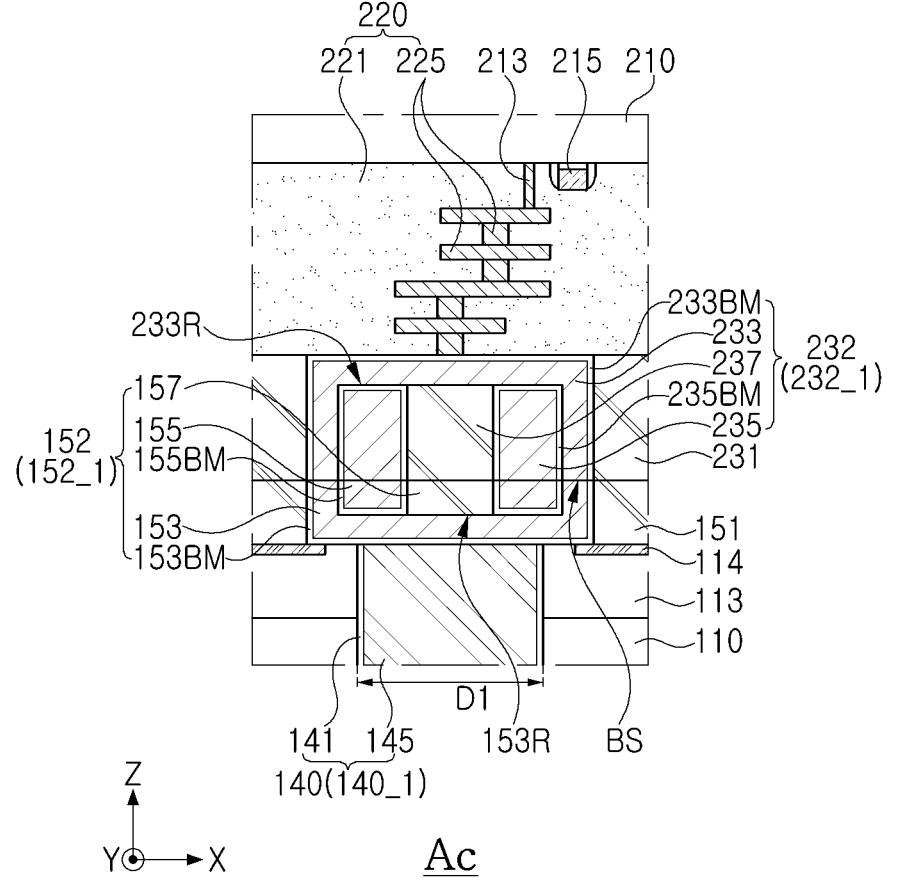
FIG. 5B is a partially enlarged view illustrating the region "Ac" of FIG. 5A.

FIG. 5A is a cross-sectional view illustrating a semiconductor package 10*c* according to an example embodiment of the present disclosure, and FIG. 5B is a partially enlarged view illustrating the region "A*c*" of FIG. 5A.

Referring to FIGS. 5A and 5B, the semiconductor package 10*c* according to an example embodiment may have feature(s) the same as or similar to those described with reference to FIGS. 1A to 4B, except that the first group of first pads 152_1 is connected to a through-electrode having a relatively large width.

For example, the plurality of through-electrodes 140 includes a first group of through-electrodes 140_1 connected to the first group of pads 152_1 and a second group of through-electrodes 140_2 connected to the second group of first pads 152_2. Two groups of through-electrodes 140 may be included. The first group of through-electrodes 140_1 may include power and/or ground through-electrodes, and the second group of through-electrodes 140_2 may include a signal through-electrode. The first group of through-electrodes 140_1 may have a width D1 greater than the width D2 of the second group of through-electrodes 140_2. As described above, by connecting the first group of through-electrodes 140_1 having a relatively large width to the first group of pads 152_1 formed with a large area, the electrical properties of the semiconductor package 10*c* may be further improved.

Figure 6A:
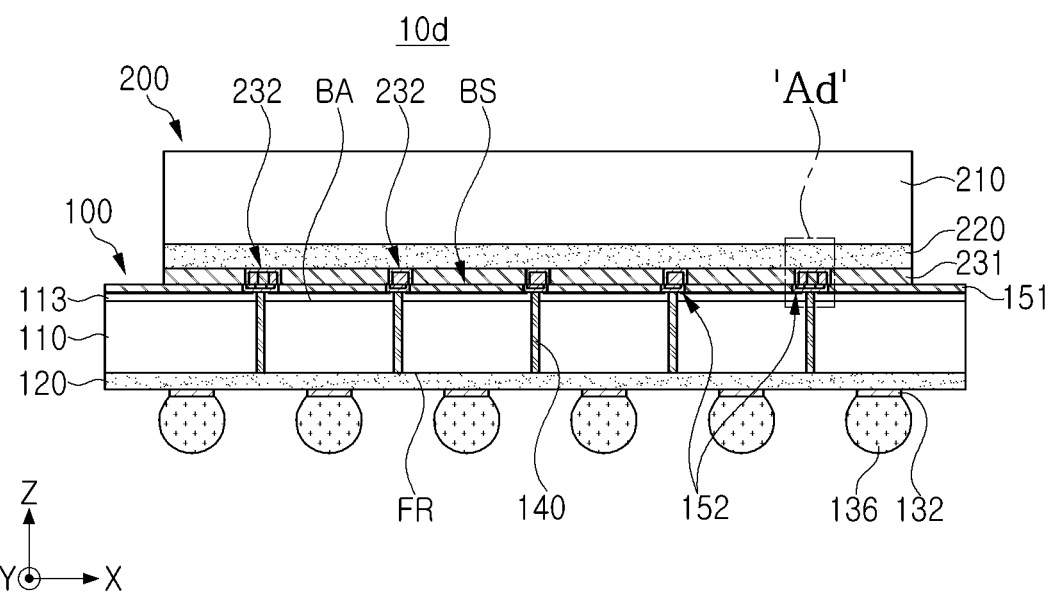
FIG. 6A is a cross-sectional view illustrating a semiconductor package according to an example embodiment of the present disclosure.
Figure 6B:
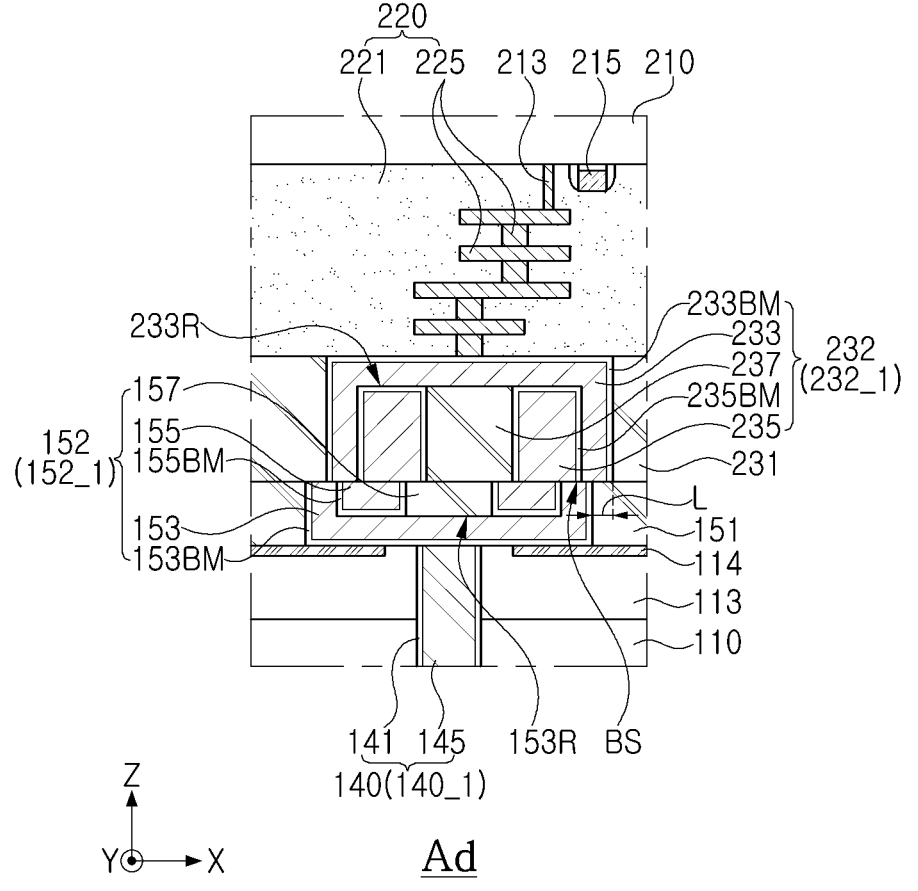
FIG. 6B is a partially enlarged view illustrating the region "Ad" of FIG. 6A.

FIG. 6A is a cross-sectional view illustrating a semiconductor package 10*d* according to an example embodiment of the present disclosure, and FIG. 6B is a partially enlarged view illustrating the region "A*d*" of FIG. 6A.

Referring to FIGS. 6A and 6B, the semiconductor package 10*d* according to an example embodiment may have feature(s) the same as or similar to those described with reference to FIGS. 1A to 5B, except that first pads 152 and second pads 232 are in contact with each other in a misaligned manner.

For example, the first group of first pads 152_1 and the third group of second pads 232_1 may be disposed to be misaligned with each other or offset from each other by a predetermined distance L in a horizontal direction (for example, an X-direction). The first conductive pattern layer 155 may be in contact with at least a portion of the third conductive pattern layer 235, and the first insulating pattern layer 157 may be in contact with at least a portion of the second insulating pattern layer 237. As described above, the first conductive pattern layer 155, the third conductive pattern layer 235, the first insulating pattern layer 157, and the second insulating pattern layer 237 may be formed to have a width enabling the first conductive pattern layer 155, the third conductive pattern layer 235, the first insulating pattern layer 157, and the second insulating pattern layer 237 to be in contact with each other. Accordingly, even when the first group of first pads 152_1 and the third group of second pads 232_1 are misaligned with each other by the predetermined distance L or have different widths, quality of the bonding interface BS between the first group of first pads 152_1 and the third group of second pads 232_1 may be secured.

Figure 7:
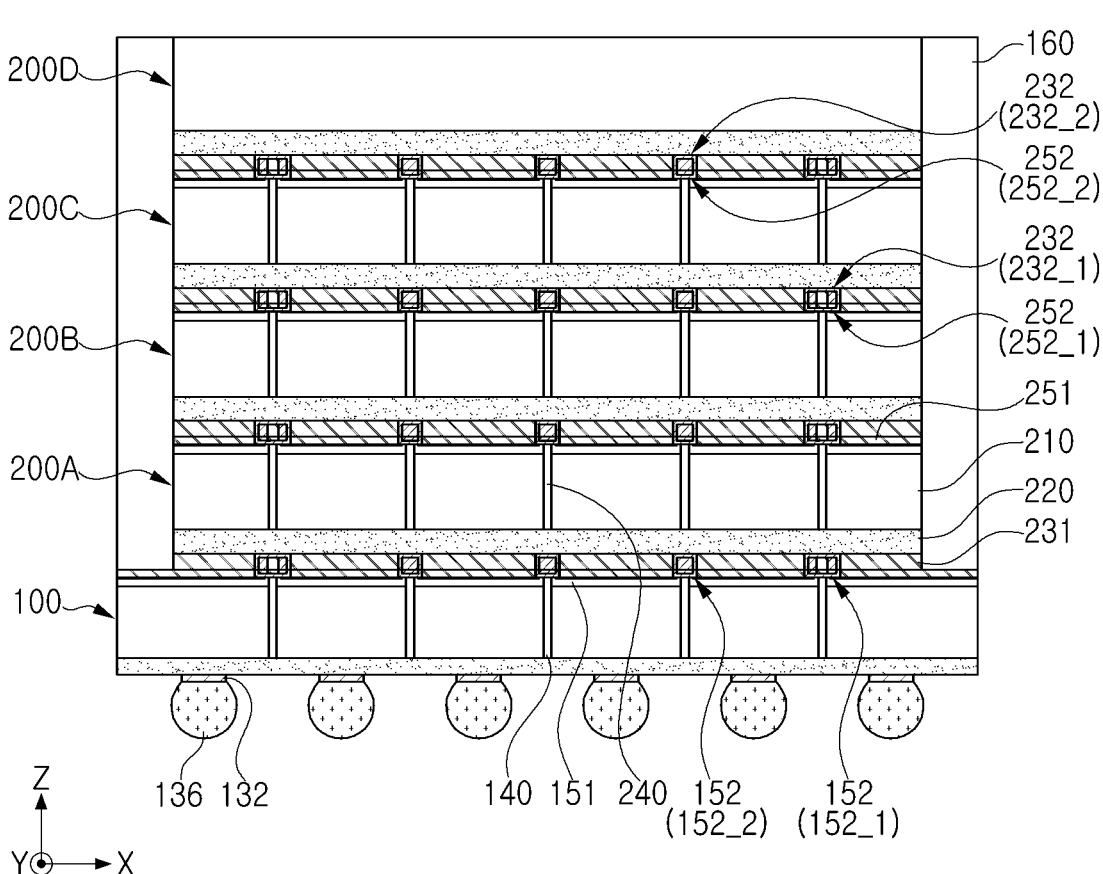
FIG. 7 is a cross-sectional view illustrating a semiconductor package according to an example embodiment of the present disclosure.

FIG. 7 is a cross-sectional view illustrating a semiconductor package 10A according to an example embodiment of the present disclosure.

Referring to FIG. 7, the semiconductor package 10A according to an example embodiment may have feature(s)

the same as or similar to those described with reference to FIGS. 1A to 6B, except that a plurality of second semiconductor chips 200A, 200B, 200C, and 200D stacked on the first semiconductor chip 100 in a vertical direction (Z-axis direction) and a molding member 160 are included.

For example, the first semiconductor chip 100 may include a first group of first back-side pads 152_1 and a second group of first back-side pads 152_2, and the plurality of second semiconductor chips 200A, 200B, 200C, and 200D may include a third group of second front-side pads 232_1 and a fourth group of second front-side pads 232_2, respectively. In addition, the plurality of second semiconductor chips 200A, 200B, 200C, and 200D may include a first group of second back-side pads 252_1 and a second group of second back-side pads 252_2. The first group of second back-side pads 252_1 and the second group of second back-side pads 252_2 may have feature(s) the same as or similar to that of the first group of first back-side pads 152_1 and the second group of first back-side pads 152_2, respectively.

A bonding interface for bonding the second back-side insulating layer 251 and the second front-side insulating layer 231 to each other, and bonding the second back-side pad 252 and the second front-side pad 232 to each other may be formed between the plurality of second semiconductor chips 200A, 200B, 200C, and 200D. The plurality of second semiconductor chips 200A, 200B, 200C, and 200D may be electrically connected to each other by the second back-side pad 252 and the second front-side pad 232 bonded to each other. A lowermost second semiconductor chip 200A among the plurality of second semiconductor chips 200A, 200B, 200C, and 200D may be electrically connected to the first semiconductor chip 100 by the second front-side pad 232 and the first back-side pad 152 of the first semiconductor chip 100 bonded to each other.

The second semiconductor chips 200A, 200B, 200C, and 200D may have feature(s) the same as or similar to those of the second semiconductor chip 200 described with reference to FIGS. 1A to 1C, except that a second through-electrode 240 for forming a mutual electrical connection path is further included. However, a second semiconductor chip 200D disposed on an uppermost level may not include the second through-electrode 240, and may have a relatively large thickness. In some example embodiment, a greater or lesser number of semiconductor chips may be stacked on the first semiconductor chip 100 than those illustrated in the drawing. For example, three or less or five or more semiconductor chips may be stacked on the first semiconductor chip 100.

For example, the first semiconductor chip 100 may be a buffer chip or control chip including a plurality of logic devices and/or memory devices. The first semiconductor chip 100 may transmit signals from the plurality of second semiconductor chips 200A, 200B, 200C, and 200D stacked thereon to the outside, and may also transmit signals and power from the outside to the plurality of second semiconductor chips 200A, 200B, 200C, and 200D. The plurality of second semiconductor chips 200A, 200B, 200C, and 200D may include memory chips including volatile memory devices such as DRAM and SRAM or non-volatile memory devices such as PRAM, MRAM, FeRAM, and RRAM.

The molding member 160 may be disposed on the first semiconductor chip 100, and may seal at least a portion of each of the plurality of second semiconductor chips 200A, 200B, 200C, and 200D. The molding member 160 may be formed to expose an upper surface of the second semiconductor chip 200D disposed on an uppermost level. However, in some example embodiments, the molding member 160 may be formed to cover the upper surface of the uppermost second semiconductor chip 200D. The molding member 160 may include, for example, epoxy mold compound (EMC), but a material of the molding member 160 is not particularly limited.

Figure 8A:
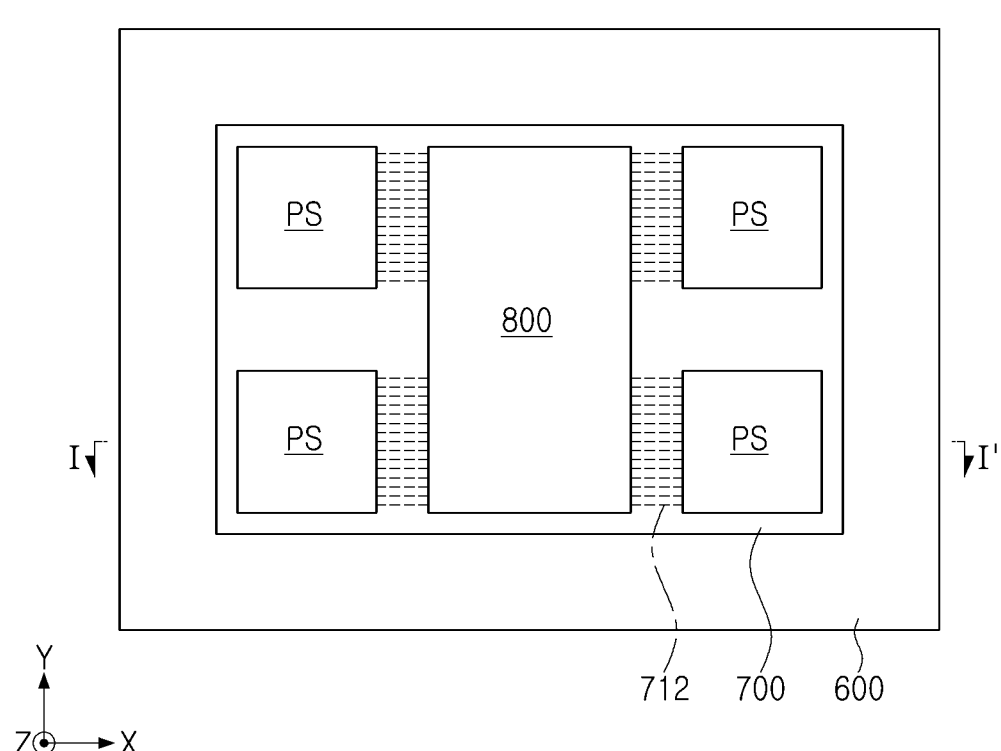
FIG. 8A is a plan view illustrating a semiconductor package according to an example embodiment of the present disclosure.
Figure 8B:
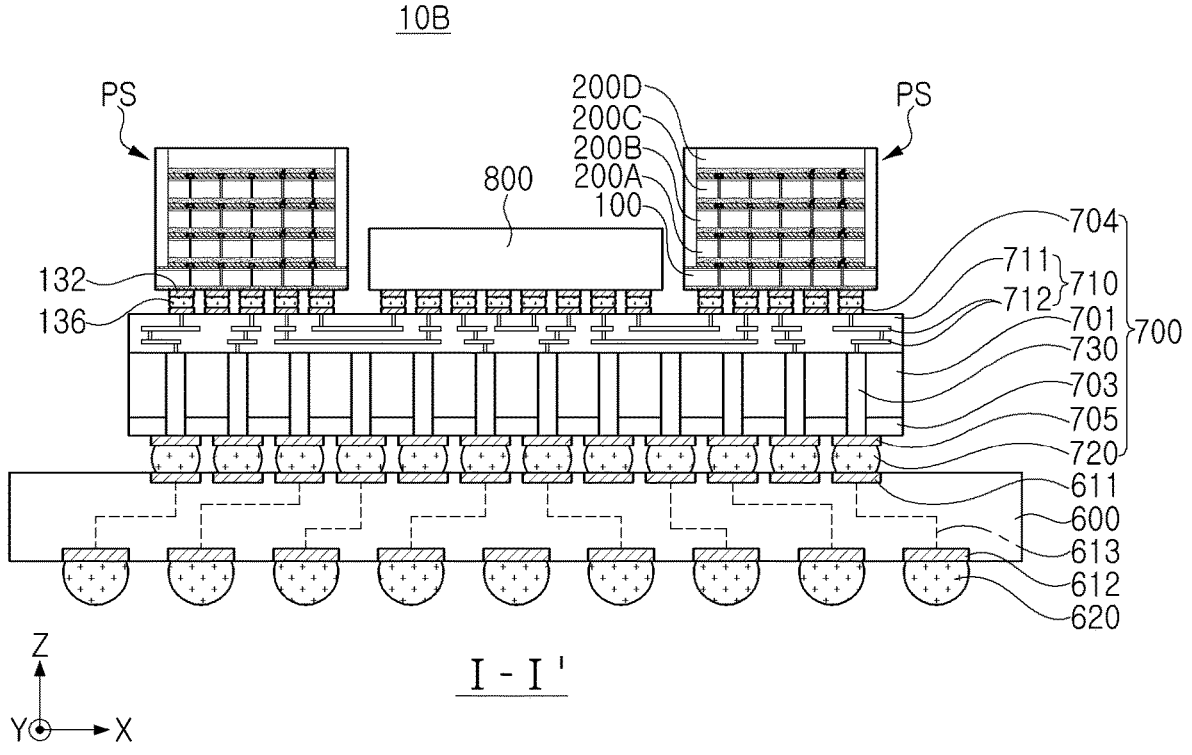
FIG. 8B is a cross-sectional view taken along the line I-I' of FIG. 8A.

FIG. 8A is a plan view illustrating a semiconductor package 10B according to an example embodiment of the present disclosure, and FIG. 8B is a cross-sectional view taken along the line I-I' of FIG. 8A.

Referring to FIGS. 8A and 8B, the semiconductor package 10B according to an example embodiment may include a package substrate 600, an interposer or interposer substrate 700, and at least one package structure PS. In addition, the semiconductor package 10B may further include a logic chip (or processor chip) 800 disposed to be adjacent to the package structure PS on the interposer substrate 700. The package structure PS may have feature(s) the same as or similar to those of the semiconductor packages 10, 10a, 10b, 10c, and 10d described with reference to FIGS. 1A to 6B. The package structure PS is illustrated as being in the form of the semiconductor package 10A illustrated in FIG. 7, but the present disclosure is not limited thereto.

The package substrate 600 may be a supporting substrate on which the interposer substrate 700, the logic chip 800, and the package structure PS are mounted, and may be a semiconductor package substrate including a printed circuit board (PCB), a ceramic substrate, a glass substrate, a tape wiring substrate, and the like. The package substrate 600 may include a lower pad 612, an upper pad 611, and a wiring circuit 613 electrically connecting the lower pad 612 and the upper pad 611 to each other. A body of the package substrate 600 may include a material varying depending on a type of substrate. For example, when the package substrate 600 is a PCB, the package substrate 600 may be in a form in which a wiring layer is additionally laminated on one side or both sides of a body copper clad laminate or a copper clad laminate. The upper pad 611, the lower pads 612, and the wiring circuit 613 may form an electrical path connecting a lower surface and an upper surface of the package substrate 600 to each other. An external connection bump 620 connected to the lower pad 612 may be disposed on the lower surface of the package substrate 600. The external connection bump 620 may include, for example, a solder ball.

The interposer substrate 700 may include a substrate 701, a lower protective layer 703, a lower pad 705, an interconnection structure 710, a conductive bump 720, and a through-via 730. The package structure PS and the processor chip 800 may be stacked on the package substrate 600 through the interposer substrate 700. The interposer substrate 700 may electrically connect the package structure PS and the processor chip 800 to each other.

The substrate 701 may be formed of, for example, one of silicon, an organic material, plastic, and a glass substrate. When the substrate 701 is a silicon substrate, the interposer substrate 700 may be referred to as a silicon interposer. Unlike that illustrated in the drawings, when the substrate 701 is an organic substrate, the interposer substrate 700 may be referred to as a panel interposer.

The lower protective layer 703 may be disposed on a lower surface of the substrate 701, and the lower pad 705 may be disposed on the lower protective layer 703. The lower pad 705 may be connected to the through-via 730. The package structure PS and the processor chip 800 may be electrically connected to the package substrate 600 through conductive bumps 720 disposed on the lower pad 705.

The interconnection structure 710 may be disposed on an upper surface of the substrate 701, and may include an interlayer insulating layer 711 and a single layer or multi-layer wiring structure 712. When the interconnection structure 710 has a multilayer wiring structure, different layers of wiring patterns may be connected to each other through a contact via. An upper pad 704 connected to the wiring structure 712 may be disposed on the interconnection structure 710. The package structure PS and the processor chip 800 may be connected to the upper pad 704 through a connection bump 136.

The through-via 730 may extend from the upper surface to the lower surface of the substrate 701 to pass through the substrate 701. For example, the through-via 730 may extend into the interconnection structure 710 to be electrically connected to wirings of the interconnection structure 710. When the substrate 701 is silicon, the through-via 730 may be referred to as a TSV.

The interposer substrate 700 may be used for the purpose of converting or transmitting an input electrical signal between the package substrate 600 and the package structure PS or the processor chip 800. Accordingly, the interposer substrate 700 may not include devices such as active devices or passive devices. In some example embodiments, the interconnection structure 710 may be disposed below the substrate 701.

The conductive bump 720 may be disposed on a lower surface of the interposer substrate 700, and may be electrically connected to a wiring of the interconnection structure 710. The interposer substrate 700 may be mounted on the package substrate 600 through the conductive bump 720. For example, some pads 705 used for power or ground among the lower pads 705 may be integrated and connected together to the conductive bump 720, such that the number of lower pads 705 may be greater than the number of conductive bumps 720.

The logic chip or processor chip 800 may be, for example, a central processor (CPU), a graphic processor (GPU), a field programmable gate array (FPGA), a digital signal processor (DSP), a cryptographic processor, a microprocessor, a microcontroller, an analog-to-digital converter, an application specific integrated circuit (ASIC), and the like. Depending on the types of integrated circuits included in the logic chip 800, the semiconductor package 10B may be referred to as a server-oriented semiconductor package or a mobile-oriented semiconductor package. In some example embodiments, a greater or lesser number of logic chips 800 and/or package structures PS mounted on the interposer substrate 700 may be provided than those illustrated in the drawings.

Figure 9A:
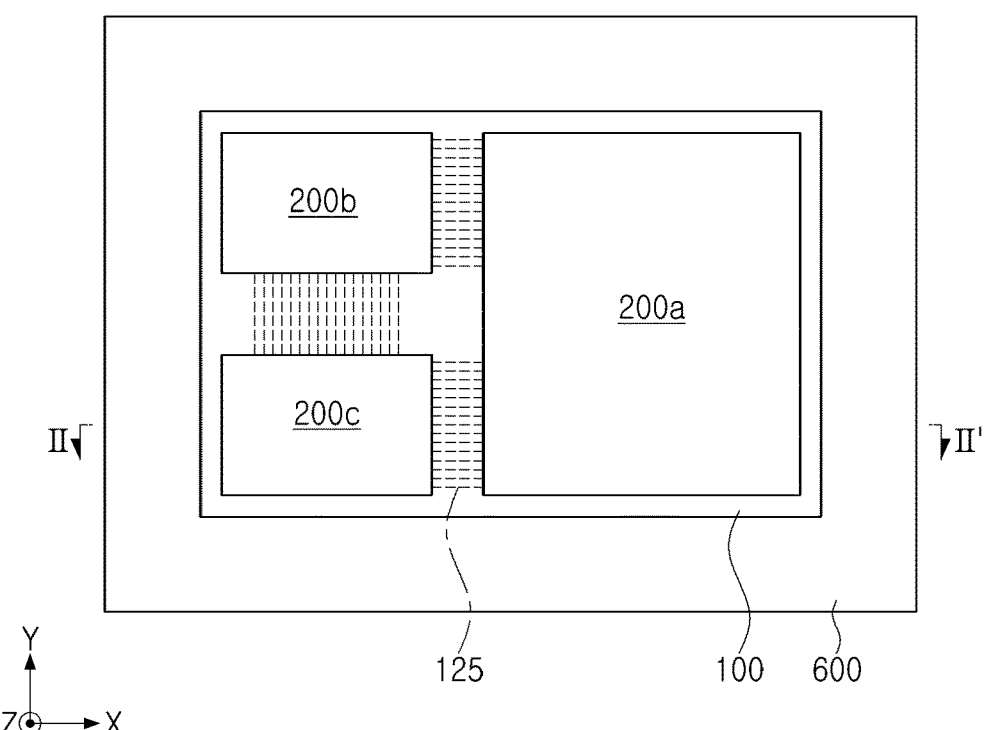
FIG. 9A is a plan view illustrating a semiconductor package according to an example embodiment of the present disclosure.
Figure 9B:
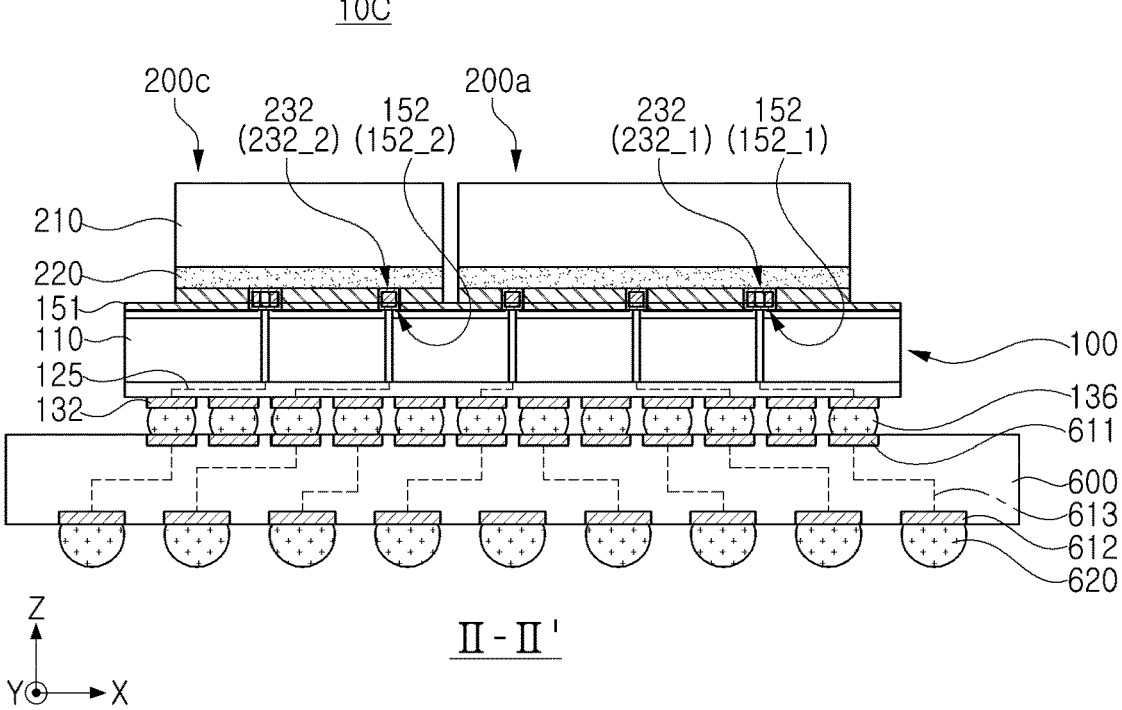
FIG. 9B is a cross-sectional view taken along the line II-II' of FIG. 9A.

FIG. 9A is a plan view illustrating a semiconductor package 10C according to an example embodiment of the present disclosure, and FIG. 9B is a cross-sectional view taken along the line II-II' of FIG. 9A.

Referring to FIGS. 9A and 9B, the semiconductor package 10C according to an example embodiment may include a plurality of second semiconductor chips 200a, 200b, and 200c horizontally disposed on the first semiconductor chip 100. In the present example embodiment, the plurality of second semiconductor chips 200a, 200b, and 200c (hereinafter, referred to as "chiplets") may include chiplets included in a multi-chip module (MCM). For example, first to third chiplets 200a, 200b, and 200c may be mounted on the first semiconductor chip 100. In some example embodiments, the first to third chiplets 200a, 200b, and 200c may be electrically connected to each other through a wiring circuit 125 of the first semiconductor chip 100.

The first semiconductor chip 100 and the first to third chiplets 200a, 200b, and 200c may include the first group of first back-side pads 152_1, second group of first back-side pads 152_2, third group of front-side pads 232_1, and fourth group of front-side pads 232_2 described with reference to FIGS. 1A to 6B.

The first semiconductor chip 100 may include an active interposer functioning as an I/O chip. For example, the first semiconductor chip 100 may include an I/O device, a DC/DC converter, a sensor, a test circuit, and the like therein. The first semiconductor chip 100 may include elements similar to the interposer substrate 700 illustrated in FIG. 8B, and thus repeated descriptions will be omitted in the interest of brevity. In the drawings, the first semiconductor chip 100 is illustrated as being in the form of a silicon interposer substrate, but a substrate applicable to the present example embodiment is not limited thereto. The first semiconductor chip 100 may be mounted on the package substrate 600.

The plurality of chiplets 200a, 200b, and 200c may be formed of different chips. For example, the first chiplet 200a may be a GPU chip, the second chiplet 200b may be a CPU chip, and the third chiplet 200c may be an FPGA chip. However, in some example embodiments, the plurality of chiplets 200a, 200b, and 200c may be formed of the same type of chips. For example, all of the first to third chiplets 200a, 200b, and 200c may include a GPU chip. The number of chiplets disposed on the first semiconductor chip 100 is not particularly limited. For example, two or less or four or more chiplets may be mounted on the first semiconductor chip 100. Here, a chiplet or chiplet technology may refer to a semiconductor chip manufactured differently depending on a size and function of a device.

FIGS. 10A to 10J are cross-sectional views illustrating a process of manufacturing the semiconductor package 10 of FIG. 1A.

Figure 10A:
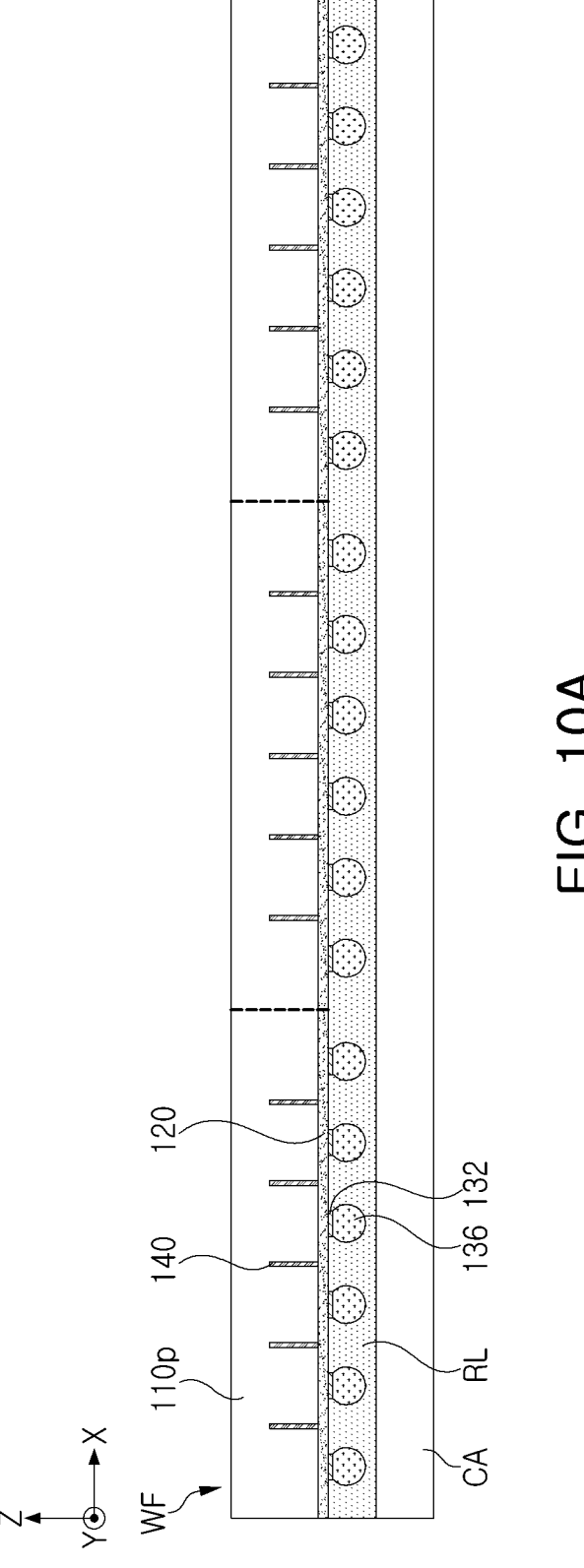
FIGS. 10A to 10J are cross-sectional views illustrating a process of manufacturing the semiconductor package of FIG. 1A.

Referring to FIG. 10A, a semiconductor wafer WF including a preliminary substrate 110p and a plurality of through-electrodes 140 arranged in the preliminary substrate 110p may be prepared.

The semiconductor wafer WF may be temporarily supported on a carrier substrate CA by a bonding material layer RL such as glue. The semiconductor wafer WF may include components for a plurality of semiconductor chips (or "first semiconductor chips"). Specifically, the semiconductor wafer WF may include a circuit layer 120 formed on an active surface of the preliminary substrate 110p, and the plurality of through-electrodes 140 connected to a wiring structure of the circuit layer 120. The plurality of through-electrodes 140 may be formed before or during the formation of the circuit layer 120, but may be formed not to entirely pass through the preliminary substrate 110p. In addition, the connection bump 136 buried in the bonding material layer RL may be disposed below the semiconductor wafer WF.

Figure 10B:
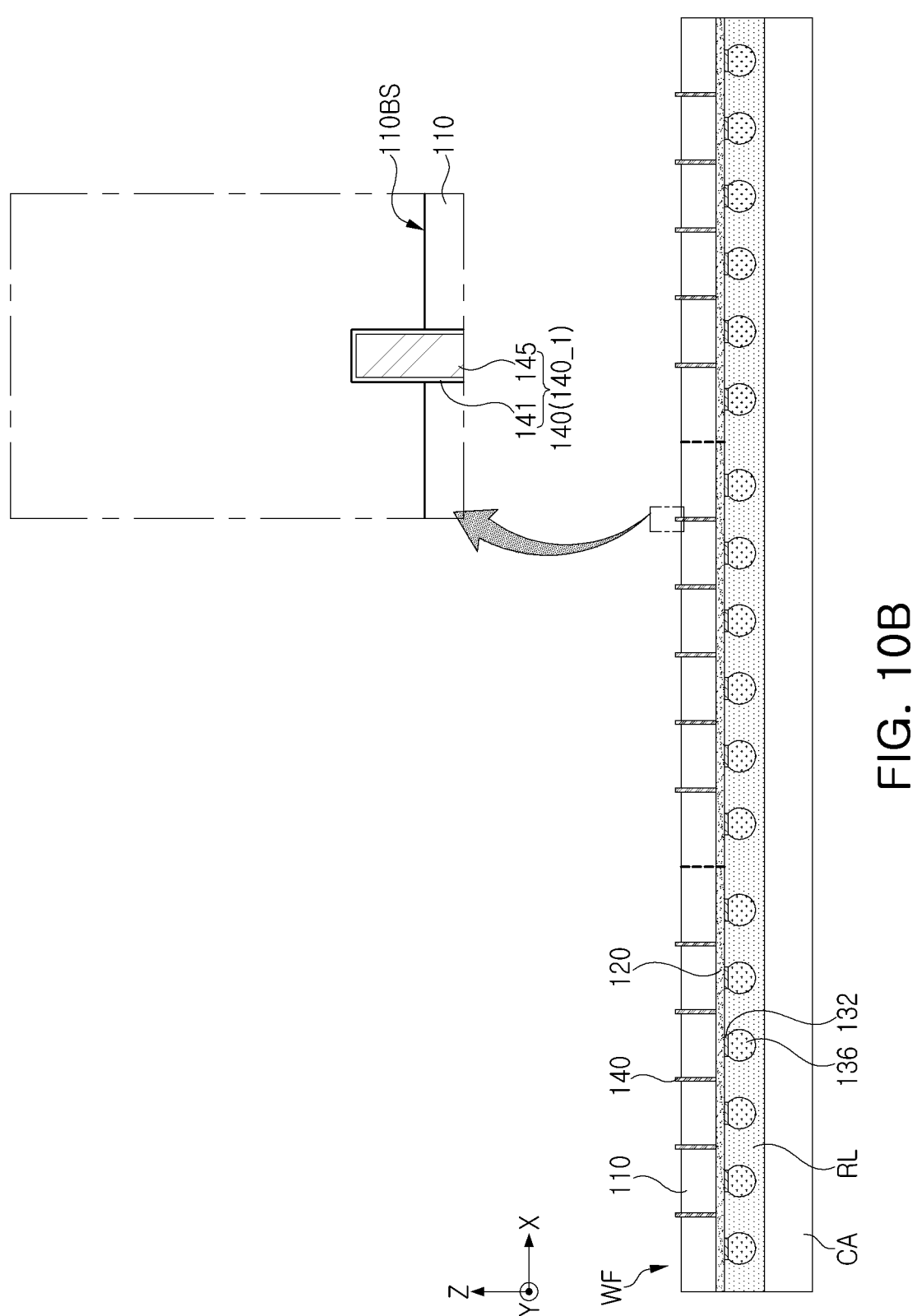

Referring to FIG. 10B, a portion of the preliminary substrate 110p may be removed to form the substrate 110 having a back surface 110BS from which the plurality of through-electrodes 140 protrude.

The substrate 110 having a desired thickness may be formed by applying a polishing process to an upper surface (inactive surface) of the preliminary substrate 110p. The polishing process may be performed by a chemical mechanical polishing (CMP) process, an etch-back process, or a combination thereof. For example, the preliminary substrate 110p may be reduced to have a predetermined thickness by performing the CMP process, and the through-electrodes 140 may be sufficiently exposed by applying the etch-back process under a proper condition.

Figure 10C:
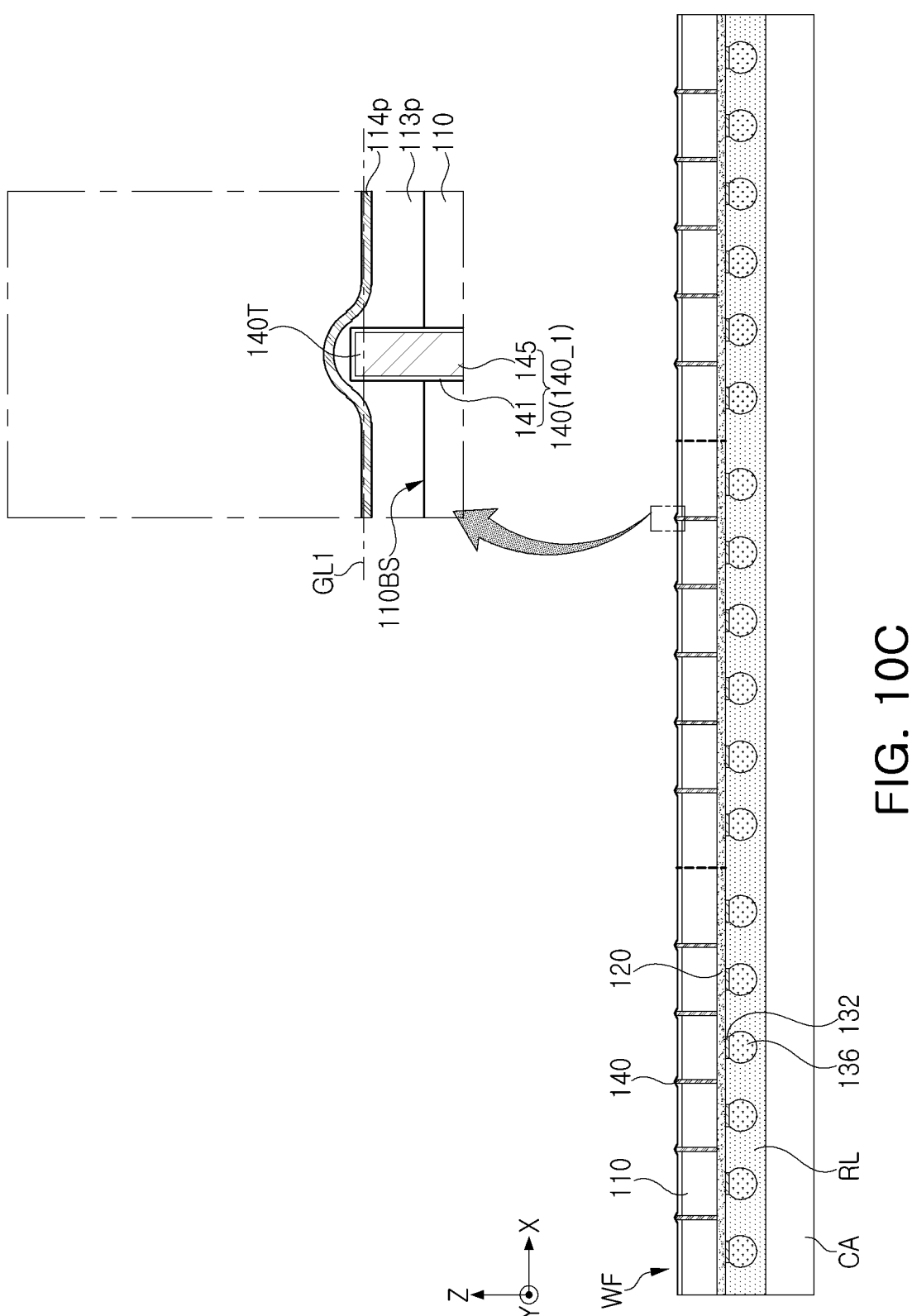

Referring to FIG. 10C, a preliminary protective layer 113p and a preliminary buffer film 114p covering upper ends 140T of the plurality of through-electrodes 140 protruding from the back surface 110BS of the substrate 110 may be formed.

The preliminary protective layer 113p may be formed of silicon oxide, and the preliminary buffer film 114p may be formed of silicon nitride or silicon oxynitride. The preliminary protective layer 113p and the preliminary buffer film 114p may be formed using a PVD process or CVD process. Subsequently, the preliminary protective layer 113p and the preliminary buffer film 114p may be planarized (for example, grinded) to expose the through-electrodes 140. By a planarization process, the preliminary protective layer 113p and the preliminary buffer film 114p may be removed up to a predetermined level or line GL1. In addition, a portion of the upper ends 140T of the through-electrodes 140 may also be removed.

Figure 10D:
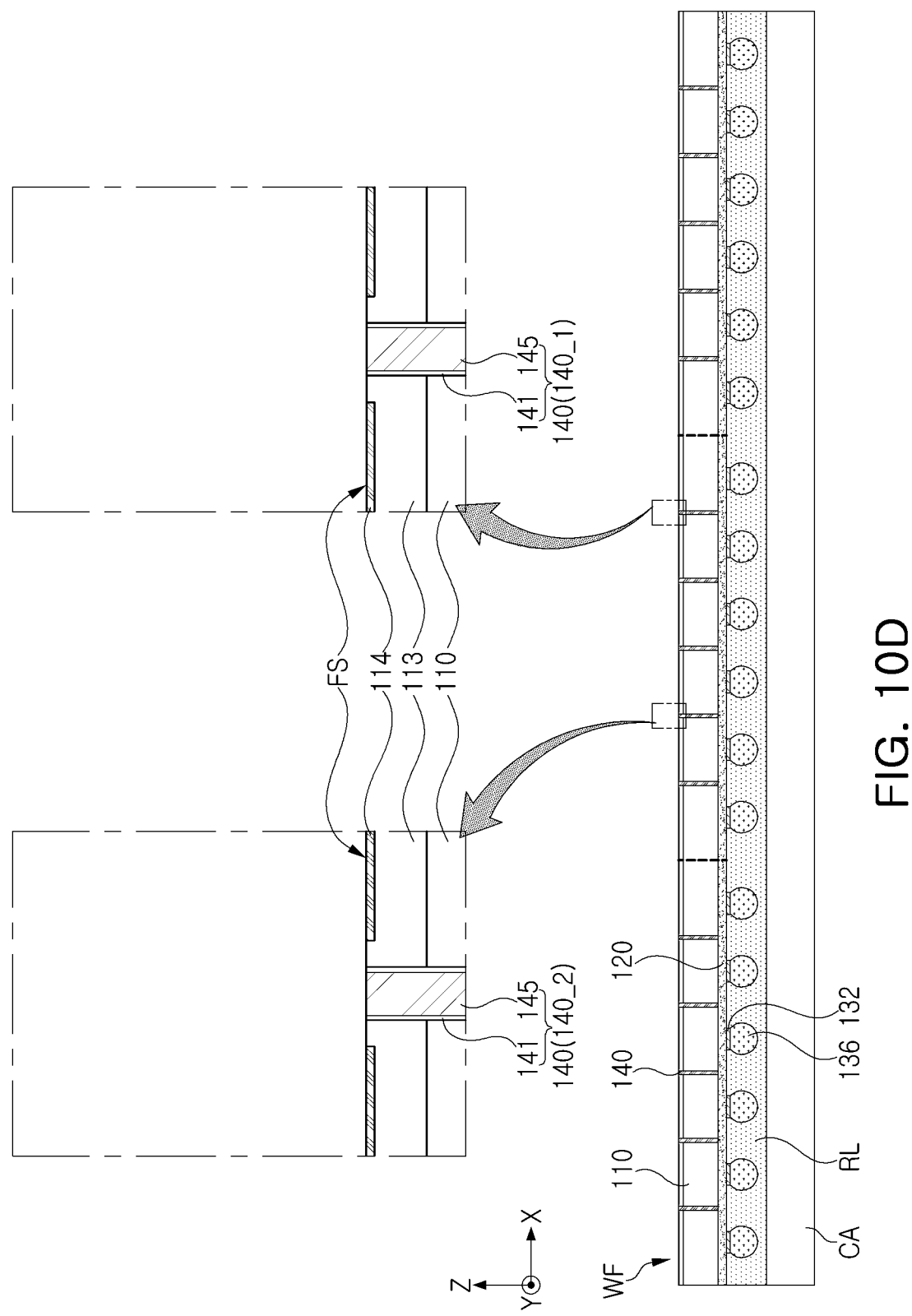

Referring to FIG. 10D, the semiconductor wafer WF may have a flat surface FS on which the protective layer 113, the buffer film 114, and the plurality of through-electrodes 140 are exposed. As described above, the upper ends 140T of the through-electrodes 140 may be partially removed by the planarization process, and thus a portion of the via plug 145 may be exposed through the flat surface FS.

Figure 10E:
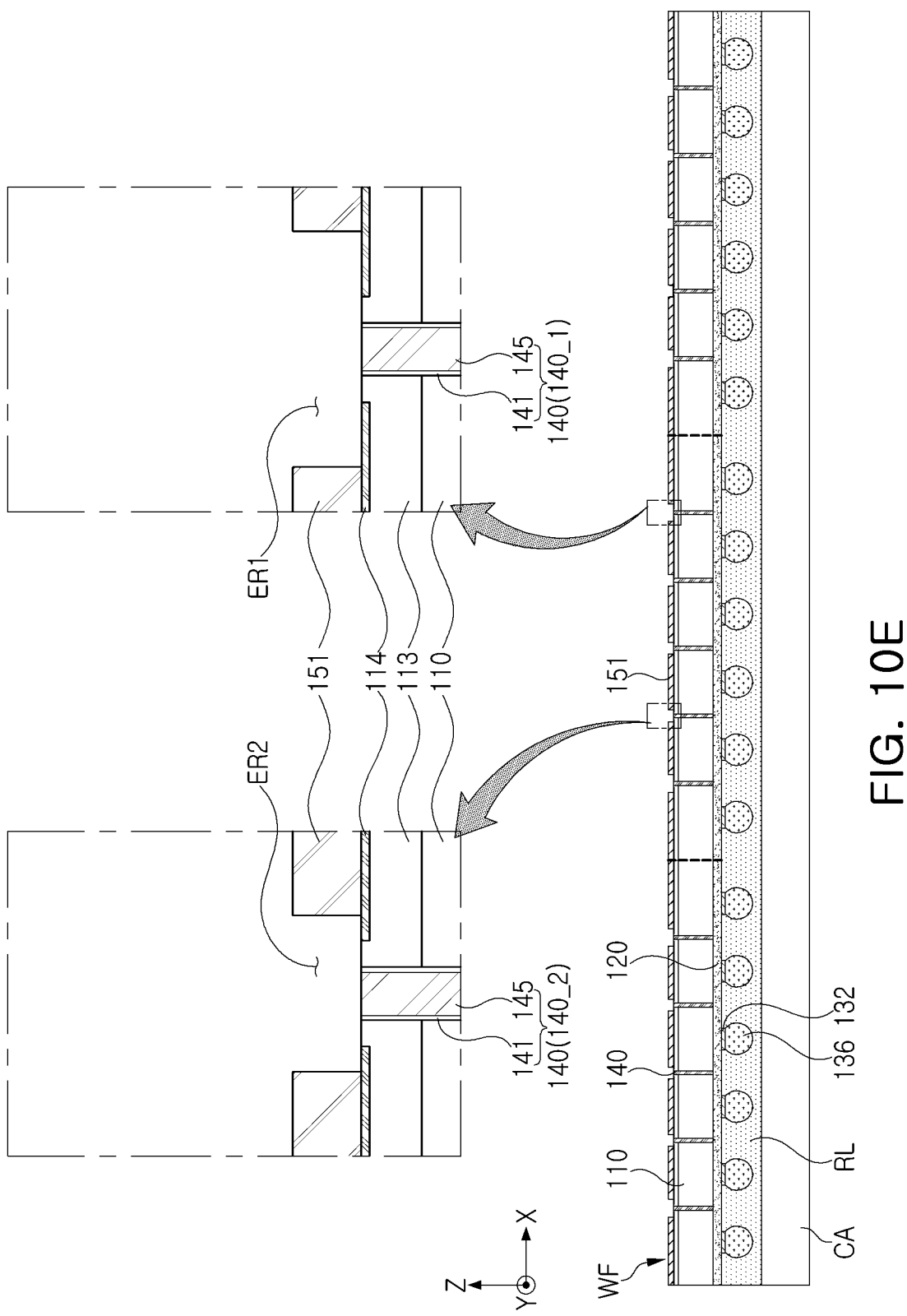

Referring to FIG. 10E, a back-side insulating layer 151 including a first etched groove ER1 and a second etched groove ER2 may be formed on the flat surface FS of FIG. 10D.

The first etched groove ER1 and the second etched groove ER2 may be formed by etching at least a portion of the preliminary insulating layer formed on the protective layer 113 and the buffer film 114. The preliminary insulating layer may include, for example, silicon oxide (SiO) and/or silicon carbonitride (SiCN), and may be formed using a PVD or CVD process. The first etched groove ER1 and the second etched groove ER2 may be formed using, for example, an etching process such as reactive-ion etching (RIE) using a photoresist. The first etched groove ER1 may be formed to have a width wider than that of the second etched groove ER2. For example, the width of the first etched groove ER1 may be about 10 μm or more.

The plurality of through-electrodes 140 may include a first group of through-electrodes 140_1 exposed through the first etched groove ER1 and a second group of through-electrodes 140_2 exposed through the second etched groove ER2. The first group of through-electrodes 140_1 may include a power through-electrode and a ground through-electrode, and the second group of through-electrodes 140_2 may include a signal through-electrode.

Figure 10F:
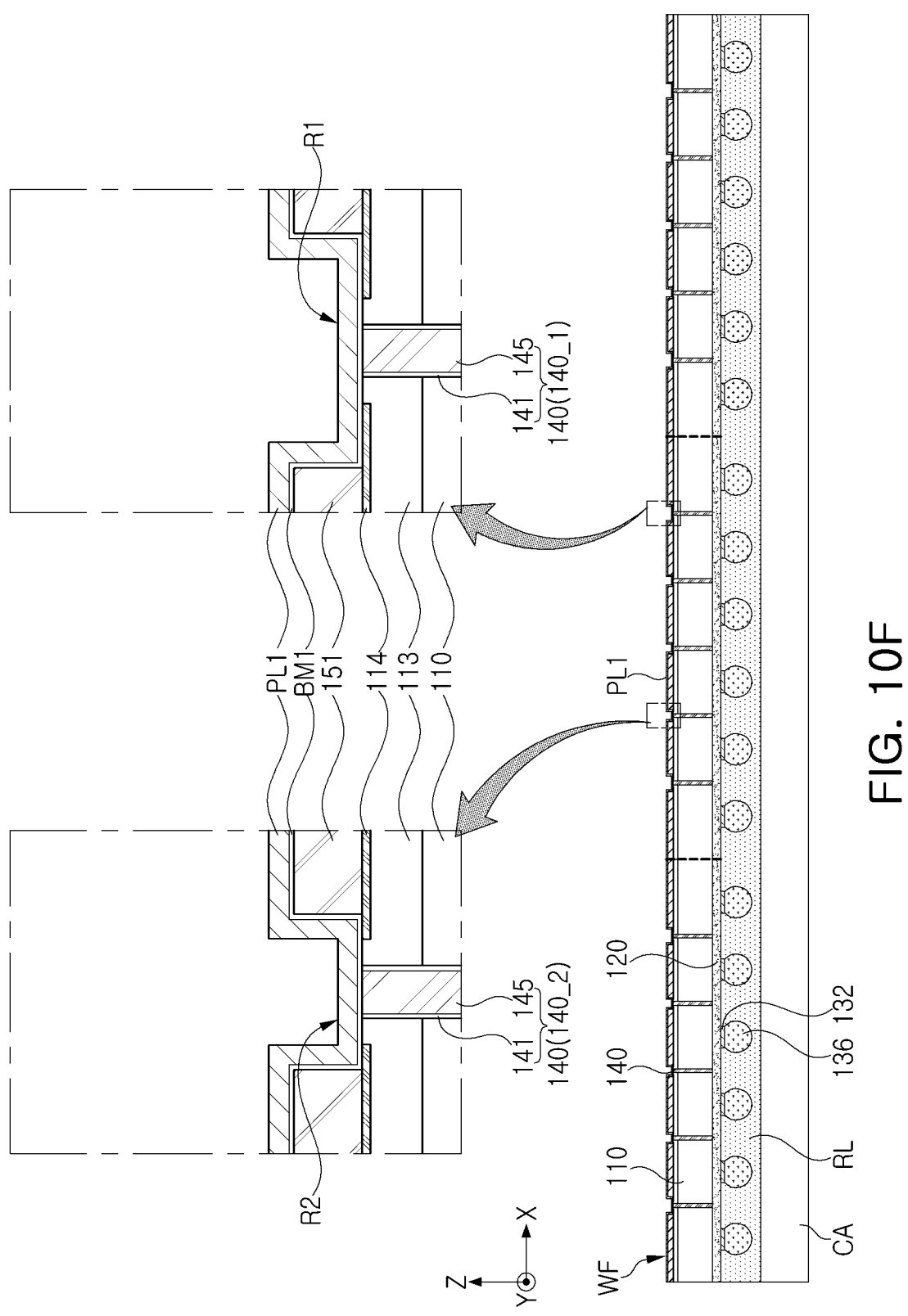

Referring to FIG. 10F, an outer preliminary barrier layer BM1 and a first conductive material layer PL1 may be formed on surfaces of the back-side insulating layer 151, the first etched groove ER1, and the second etched groove ER2.

The outer preliminary barrier layer BM1 may be conformally formed along the surface of the back-side insulating layer 151. The first conductive material layer PL1 may be formed on the outer preliminary barrier layer BM1, and may have a first recess region R1 and a first recess region R1 corresponding to the first etched groove ER1 and the second etched groove ER2, respectively. The outer preliminary barrier layer BM1 and the first conductive material layer PL1 may be formed using a plating process, a PVD process, or a CVD process. For example, the outer preliminary barrier layer BM1 may include titanium (Ti) or titanium nitride (TiN), and the first conductive material layer PL1 may include copper (Cu). A seed layer including a material the same as that of the first conductive material layer PL1 may be formed between the outer preliminary barrier layer BM1 and the first conductive material layer PL1.

Figure 10G:
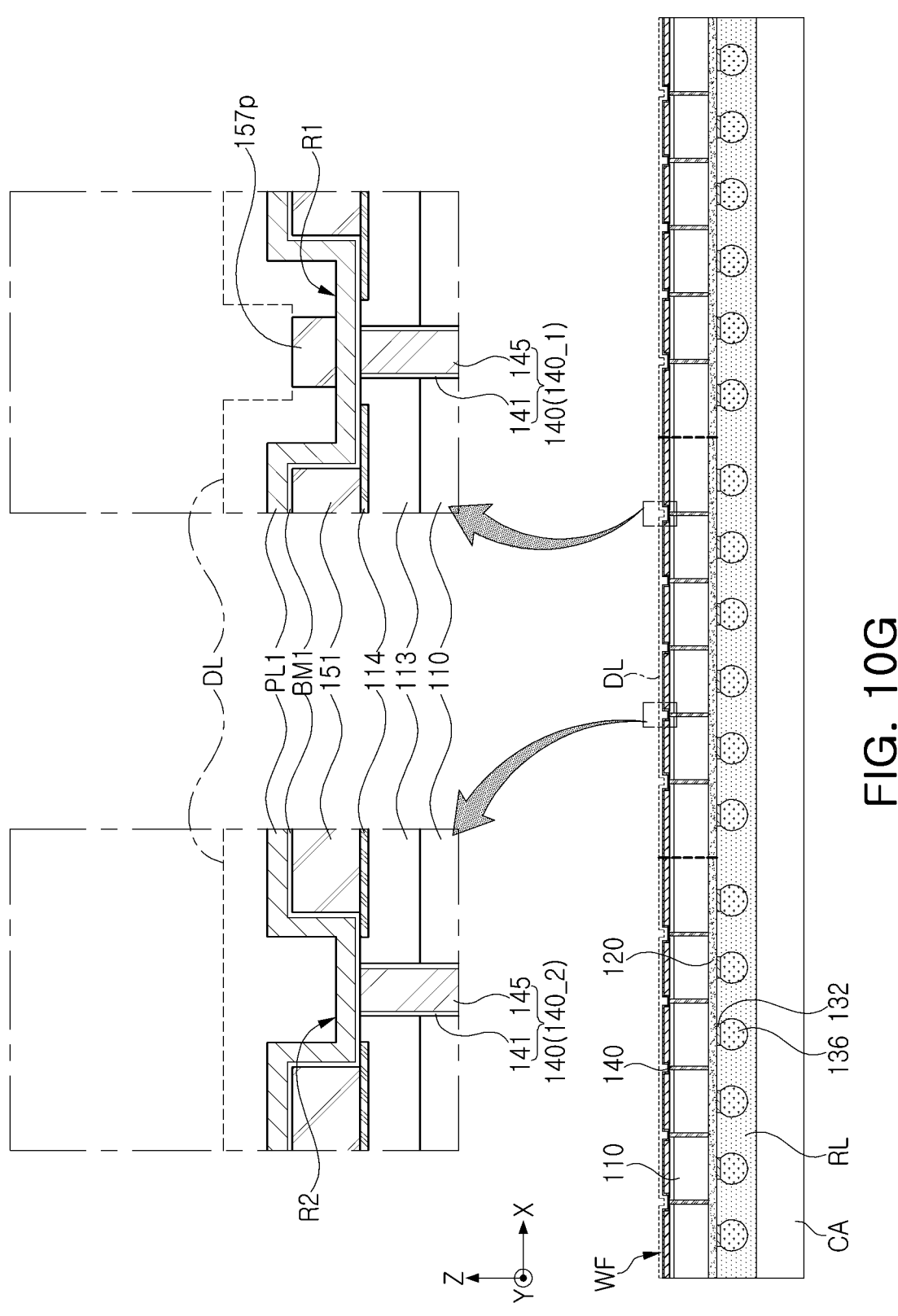

Referring to FIG. 10G, an insulating material layer DL may be formed on the first conductive material layer PL1, and then etched to form a preliminary insulating pattern layer 157p in the first recess region R1. The insulating material layer DL in the second recess region R2 may be entirely removed. The preliminary insulating pattern layer 157p may be patterned using an etching process such as RIE or the like.

Figure 10H:
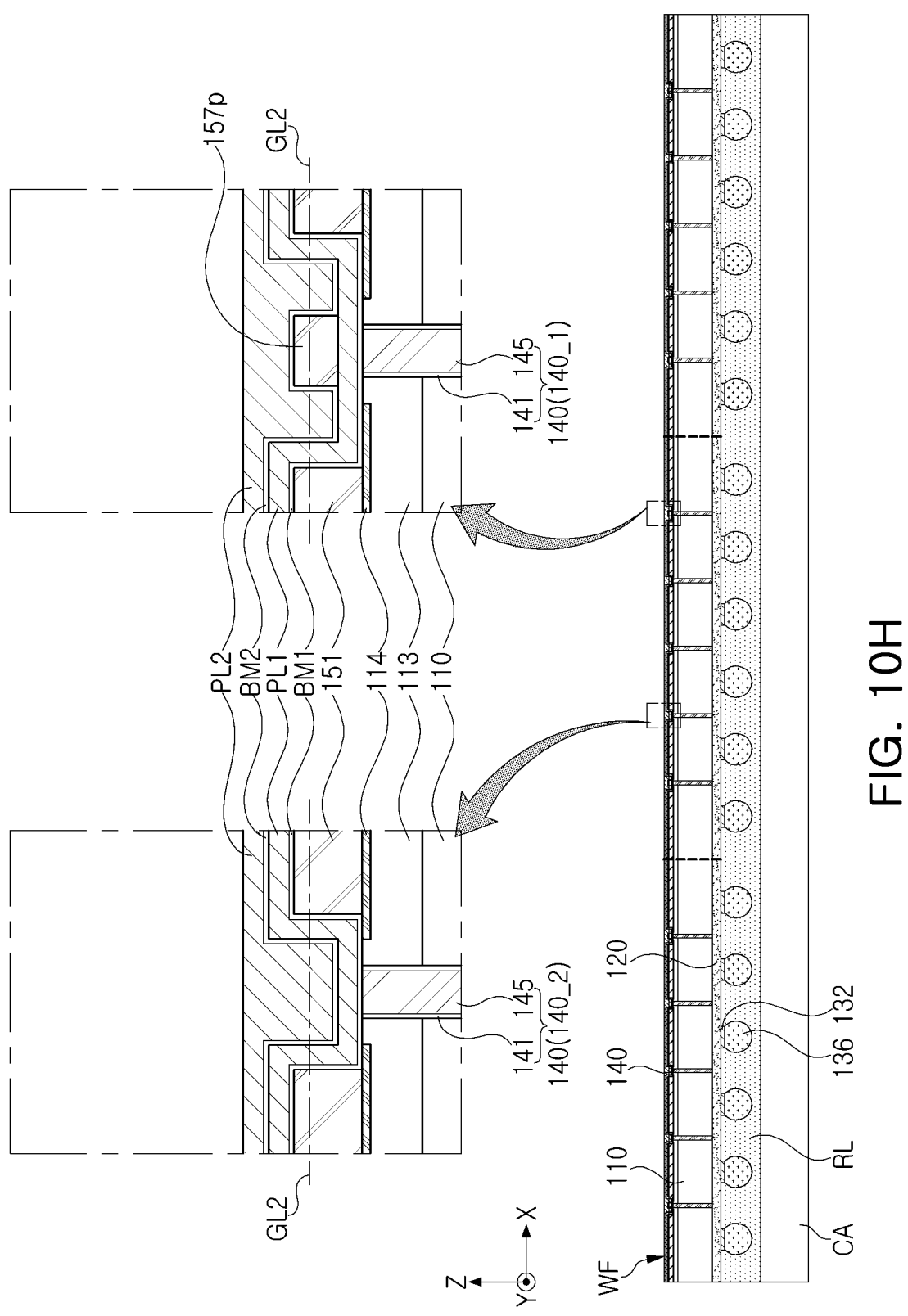

Referring to FIG. 10H, an inner preliminary barrier layer BM2 and a second conductive material layer PL2 may be formed on surfaces of the first conductive material layer PL1 and the preliminary insulating pattern layer 157p.

The inner preliminary barrier layer BM2 may be conformal formed along surfaces of the first recess region ("R1" in FIG. 10G) and the second recess region ("R2" in FIG. 10G) of the first conductive material layer PL1. The second conductive material layer PL2 may be formed to entirely fill a surface of the inner preliminary barrier layer BM2 (e.g., entirely fill the first and second recess regions R1 and R2 with the inner preliminary barrier layer BM2 therein). The inner preliminary barrier layer BM2 and the second conductive material layer PL2 may be formed using a plating process, a PVD process, or a CVD process. For example, the inner preliminary barrier layer BM2 may include titanium (Ti) or titanium nitride (TiN), and the second conductive material layer PL2 may include copper (Cu). A seed layer including a material the same as that of the second conductive material layer PL2 may be formed between the inner preliminary barrier layer BM2 and the second conductive material layer PL2.

Subsequently, the back-side insulating layer 151, the outer preliminary barrier layer BM1, the first conductive material layer PL1, the preliminary insulating pattern layer 157p, the inner preliminary barrier layer BM2, and the second conductive material layer PL2 may be removed by a planarization process up to a predetermined level or line GL2.

Figure 10I:
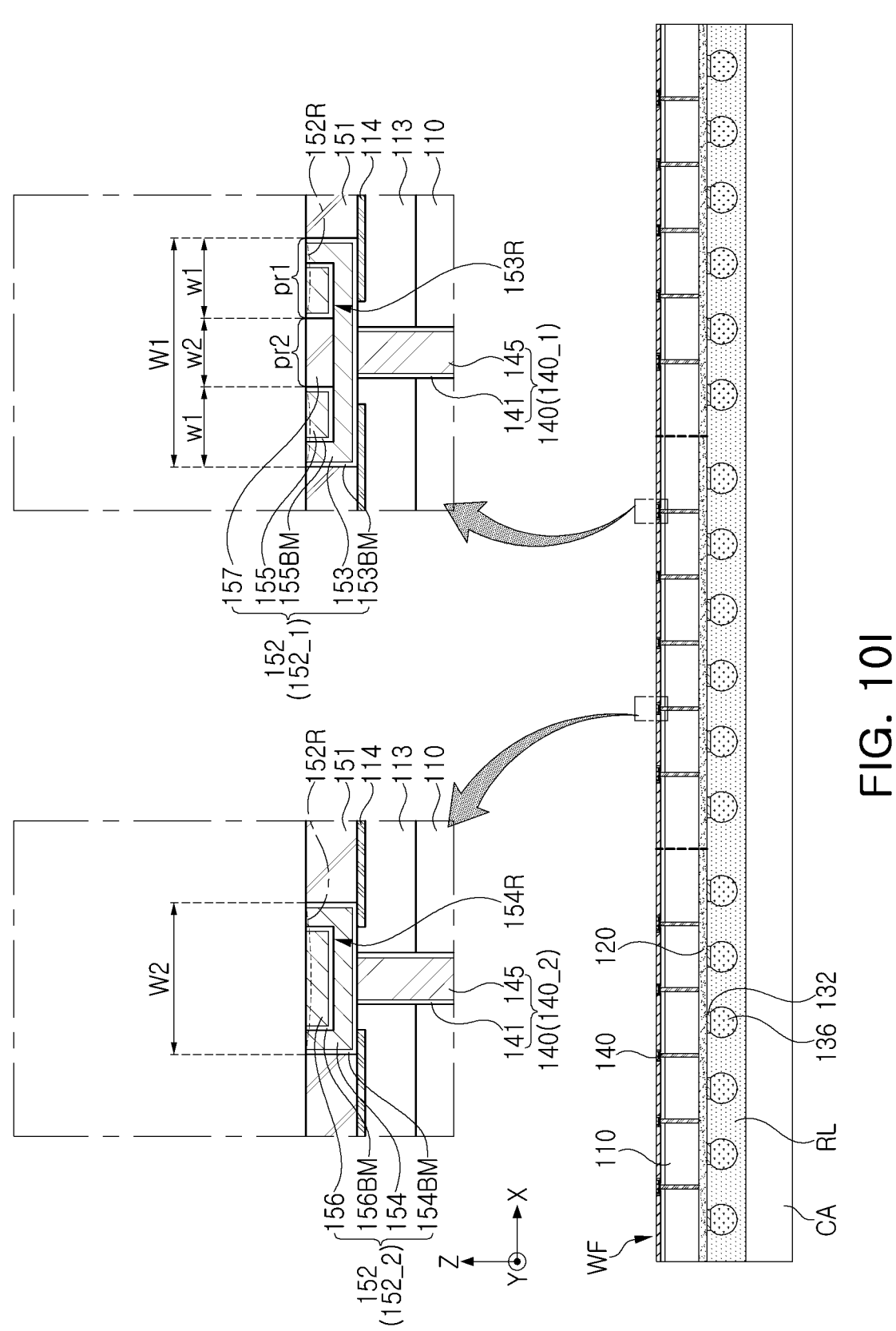

Referring to FIG. 10I, the semiconductor wafer WF may have the first group of first pads 152_1 and the second group of first pads 152_2 through a planarization process.

The first group of first pads 152_1 may include the first outer barrier layer 153BM formed by the outer preliminary barrier layer BM1, the first base layer 153 formed by the first conductive material layer PL1, the first insulating pattern layer 157 formed by the preliminary insulating pattern layer 157p, the first inner barrier layer 155BM formed by the inner preliminary barrier layer BM2, and the first conductive pattern layer 155 formed by the second conductive material layer PL2. The first group of first pads 152_1 may have an upper surface defined by the first outer barrier layer 153BM, the first base layer 153, the first inner barrier layer 155BM, the first conductive pattern layer 155, and the first insulating pattern layer 157. A first dishing surface 152R may be formed on upper surfaces of the first group of first pads 152_1.

The second group of first pads 152_2 may include the second outer barrier layer 154BM formed by the outer preliminary barrier layer BM1, the second base layer 154 formed by the first conductive material layer PL1, the second inner barrier layer 156BM formed by the inner preliminary barrier layer BM2, and the second conductive pattern layer 156 formed by the second conductive material layer PL2. The second group of first pads 152_2 may have an upper surface defined by the second outer barrier layer 154BM, the second base layer 154, the second inner barrier layer 156BM, and the second conductive pattern layer 156. The first dishing surface 152R may be formed on upper surfaces of the second group of first pads 152_2.

The first group of first pads 152_1 may have the first width W1 wider than the second width W2 of the second group of first pads 152_2.

The first group of first pads 152_1 may have the first portion pr1 defined by an outer wall of the first base layer 153 and the first conductive pattern layer 155 adjacent thereto, and a second portion pr2 defined by the first insulating pattern layer 157. The width w 1 of the first portion pr1 may be on a level similar to that of the second width W2 of the second group of first pads 152_2. The width w2 of the second portion pr2 may be equal to or narrower than the width w1 of the first portion pr1. Accordingly, a width, depth, and the like of the dishing surface 152R formed on the upper surfaces of the first group of first pads 152_1 and the upper surfaces of the second group of first pads 152_2 may be properly controlled.

Figure 10J:
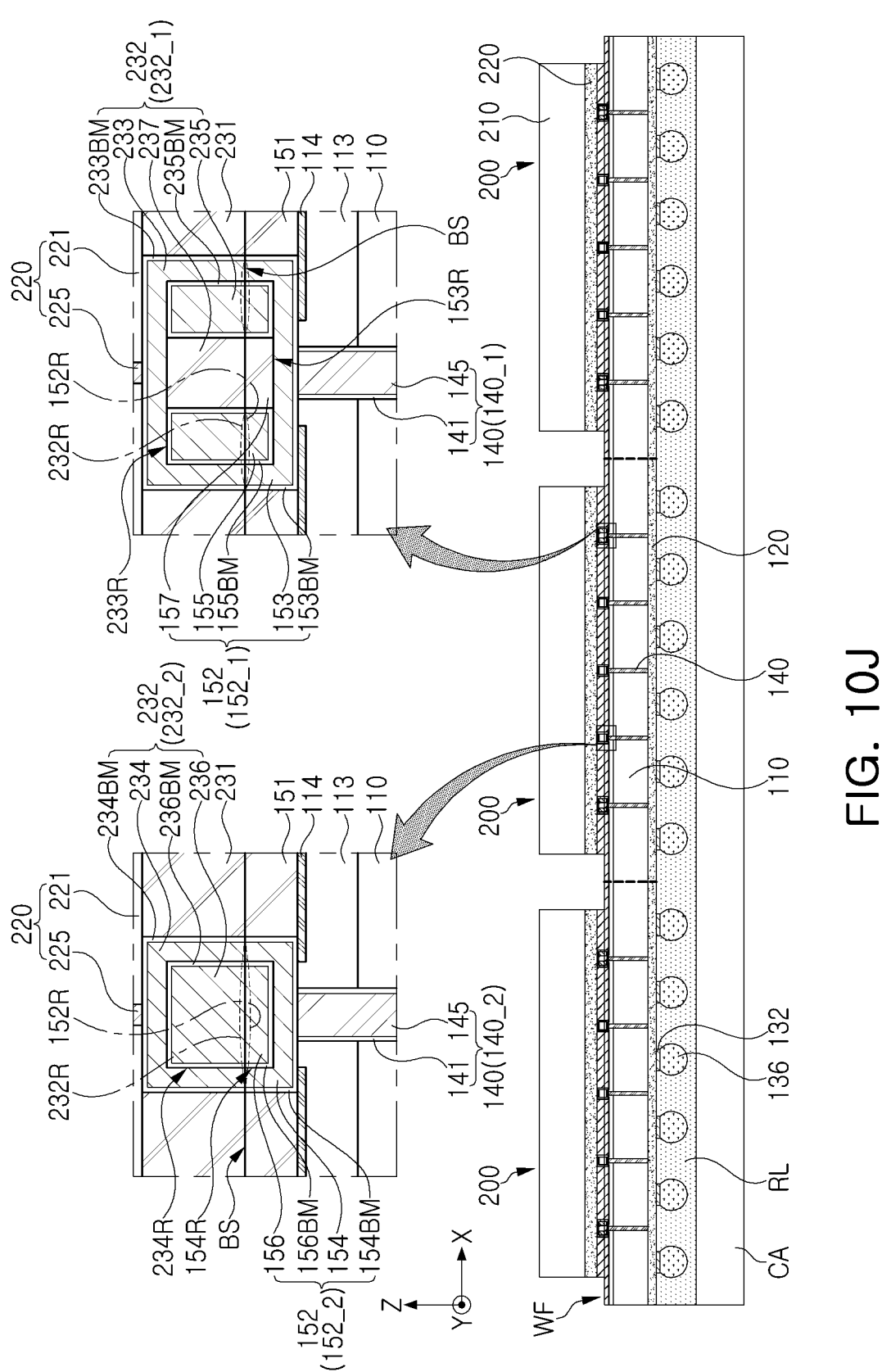

Referring to FIG. 10J, the plurality of second semiconductor chips 200 may be disposed on the semiconductor wafer WF. Each of the plurality of second semiconductor chips 200 may include a third group of second pads 232_1 and a fourth group of second pads 232_2 formed by a manufacturing process similar to those of FIGS. 10E to 10I. The semiconductor wafer WF and the plurality of second semiconductor chips 200 may not be necessarily provided, but may be respectively formed through an independent manufacturing process. The plurality of second semiconductor chips 200 may be disposed on the semiconductor wafer WF using, for example, a pick-and-place device. The plurality of second semiconductor chips 200 may be aligned on the semiconductor wafer WF such that the third group of second pads 232_1 and the fourth group of second pads 232_2 correspond to or align with the first group of first pads 152_1 and the second group of first pads 152_2, respectively.

The third group of second pads 232_1 corresponding to the first group of first pads 152_1 may include the third outer barrier layer 233BM, the third base layer 233, the second insulating pattern layer 237, the third inner barrier layer 235BM, and the third conductive pattern layer 235. The third group of second pads 232_1 may have a lower surface defined by the third outer barrier layer 233BM, the third base layer 233, the third inner barrier layer 235BM, the third conductive pattern layer 235, and the second insulating pattern layer 237. A second dishing surface 232R may be formed on lower surfaces of the third group of second pads 232_1.

The fourth group of second pads 232_2 corresponding to the second group of first pads 152_2 may include the fourth outer barrier layer 234BM, the fourth base layer 234, the fourth inner barrier layer 236BM, and the fourth conductive pattern layer 236. The fourth group of second pads 232_2 may have a lower surface defined by the fourth outer barrier layer 234BM, the fourth base layer 234, the fourth inner barrier layer 236BM, and the fourth conductive pattern layer 236. The second dishing surface 232R may be formed on lower surfaces of the fourth group of second pads 232_2.

Then, a thermal compression process may be performed to couple, to each other, the first insulating layer 151 and second insulating layer 231 to be bonded to each other, and the plurality of first pads 152 and plurality of second pads 232 to be bonded to each other. For example, the thermal compression process may be performed in a thermal atmosphere ranging from about 100° C. to about 300° C. However, a temperature of the thermal atmosphere is not limited to the above-described range (about 100° C. to about 300° C.) and may be changed in various manners. During the thermal compression process, the first dishing surface 152R and the second dishing surface 232R may expand, such that the bonding interface BS between the plurality of first pads 152 and the plurality of second pads 232 may be formed.

According to the above-described manufacturing method of an example embodiment of the present disclosure, the first group of first pads 152_1 and the third group of second pads 232_1 having a relatively large width may be introduced, thereby improving electrical properties, for example, PI properties of a semiconductor package.

In addition, the first insulating pattern layer 157 and the second insulating pattern layer 237 may be introduced into the first group of first pads 152_1 and the third group of second pads 232_1, respectively, thereby controlling dishing surfaces the first group of first pads 152_1 and the third group of second pads 232_1, and securing quality of the bonding interface BS.

While example embodiments have been shown and described above, it will be apparent to those skilled in the art that modifications and variations could be made without departing from the scope of the present disclosure as defined by the appended claims.

What is claimed is:

1. A semiconductor package comprising:
a first semiconductor chip including a first substrate, a plurality of first pads on the first substrate, a first insulating layer surrounding side surfaces of the plurality of first pads, and a plurality of through-electrodes extending through the first substrate and connected to the plurality of first pads; and
a second semiconductor chip on the first semiconductor chip, the second semiconductor chip including a second substrate, a plurality of second pads below the second substrate and in contact with the plurality of first pads, and a second insulating layer surrounding side surfaces of the plurality of second pads and in contact with the first insulating layer,
wherein the plurality of first pads includes:
a first group of first pads each including a first base layer including a first recess, and a first conductive pattern layer and a first insulating pattern layer alternately disposed in the first recess, and
a second group of first pads each including a second base layer including a second recess, and a second conductive pattern layer disposed in the second recess.

2. The semiconductor package of claim 1, wherein the first group of first pads have a first width wider than a second width of the second group of first pads.

3. The semiconductor package of claim 2, wherein the first width is about 10 μm or more.

4. The semiconductor package of claim 1, wherein an uppermost surface of the first base layer, an uppermost surface of the first conductive pattern layer, and an uppermost surface of the first insulating pattern layer are substantially coplanar.

5. The semiconductor package of claim 1, wherein a depth of the first recess is greater than or equal to about 50% and less than about 100% of a thickness of the first group of first pads.

6. The semiconductor package of claim 1, wherein the first group of first pads each include:
a first portion defined by an outer wall of the first base layer surrounding the first recess, or the outer wall and the first conductive pattern layer adjacent the outer wall; and
a second portion defined by the first insulating pattern layer, and
a width of the second portion is substantially equal to or smaller than a width of the first portion.

7. The semiconductor package of claim 6, wherein the width of the first portion is less than or equal to about 5 μm.

8. The semiconductor package of claim 1, wherein the first group of first pads each further include a first outer barrier layer extending along a side surface and a lower surface of the first base layer, and a first inner barrier layer extending along a side surface and a lower surface of the first conductive pattern layer, and
the second group of first pads each further include a second outer barrier layer extending along a side surface and a lower surface of the second base layer, and a second inner barrier layer extending along a side surface and a lower surface of the second conductive pattern layer.

9. The semiconductor package of claim 8, wherein the first outer barrier layer, the first inner barrier layer, the second outer barrier layer, and the second inner barrier layer include at least one of titanium (Ti), titanium nitride (TiN), tantalum (Ta), and tantalum nitride (TaN).

10. The semiconductor package of claim 1, wherein the first insulating pattern layer includes a material the same as that of the first insulating layer.

11. The semiconductor package of claim 10, wherein the first insulating layer and the first insulating pattern layer include at least one of silicon oxide (SiO) and silicon carbonitride (SiCN).

12. The semiconductor package of claim 1, wherein the plurality of through-electrodes includes power through-electrodes and ground through-electrodes connected to the first group of first pads, and signal through-electrodes connected to the second group of first pads.

13. The semiconductor package of claim 1, wherein the plurality of through-electrodes includes a first group of through-electrodes corresponding to the first group of first pads in a ratio of 2:1 or more, and a second group of through-electrodes corresponding to the second group of first pads in a ratio of 1:1.

14. The semiconductor package of claim 1, wherein the plurality of second pads includes:
a third group of second pads each including a third base layer including a third recess, and a third conductive pattern layer and a second insulating pattern layer alternately disposed in the third recess, the third group of second pads in contact with the first group of first pads; and
a fourth group of second pads each including a fourth base layer including a fourth recess, and a fourth conductive pattern layer disposed in the fourth recess, the fourth group of second pads in contact with the second group of first pads.

15. The semiconductor package of claim 14, wherein the third group of second pads have a third width wider than a fourth width of the fourth group of second pads.

16. A semiconductor package comprising:
a first semiconductor chip including a first substrate, a plurality of first pads on the first substrate, and a first insulating layer at least partially surrounding the plurality of first pads; and a second semiconductor chip on the first semiconductor chip, the second semiconductor chip including a second substrate, a plurality of second pads below the second substrate and in contact with the plurality of first pads, and a second insulating layer at least partially surrounding the plurality of second pads and in contact with the first insulating layer, wherein at least one of the plurality of first pads includes a base layer including a recess, an outer barrier layer extending along a side surface and a lower surface of the base layer, at least one conductive pattern layer and at least one insulating pattern layer alternately disposed in the recess, and an inner barrier layer extending along a side surface and a lower surface of the at least one conductive pattern layer, and includes an upper surface defined by the base layer, the outer barrier layer, the at least one conductive pattern layer, the inner barrier layer, and the at least one insulating pattern layer.

17. The semiconductor package of claim 16, wherein a width of the at least one insulating pattern layer is equal to or less than a sum of widths of the at least one conductive pattern layer and the base layer adjacent each other on an outer periphery of the at least one of the plurality of first pads.

18. The semiconductor package of claim 16, wherein
the at least one conductive pattern layer includes an outer pattern layer adjacent an outer wall of the base layer surrounding the recess, and an inner pattern layer spaced apart from the outer pattern layer, and the at least one insulating pattern layer fills a space between the outer pattern layer and the inner pattern layer.

19. The semiconductor package of claim 18, wherein a width of the inner pattern layer is wider than a width of the outer pattern layer.

20. A semiconductor package comprising:
a first semiconductor chip including a first substrate, a plurality of first pads on the first substrate, a first insulating layer surrounding side surfaces of the plurality of first pads, and a plurality of through-electrodes passing through the first substrate and connected to the plurality of first pads; and
a second semiconductor chip on the first semiconductor chip, the second semiconductor chip including a second substrate, a plurality of second pads below the second substrate and in contact with the plurality of first pads, and a second insulating layer surrounding side surfaces of the plurality of second pads and in contact with the first insulating layer,
wherein at least one of the plurality of first pads includes a base layer including a recess and an outer wall surrounding the recess, and a conductive pattern layer and an insulating pattern layer in the recess, and
an uppermost surface of the outer wall of the base layer and an uppermost surface of the conductive pattern layer are in contact with at least one of the plurality of second pads.

* * * * *